United States Patent
Liu et al.

(10) Patent No.: US 12,431,862 B2
(45) Date of Patent: Sep. 30, 2025

(54) ACOUSTIC WAVE DEVICE HAVING MULTIPLE PIEZOELECTRIC LAYERS BETWEEN ELECTRODES

(71) Applicant: Skyworks Solutions, Inc., Irvine, CA (US)

(72) Inventors: Jiansong Liu, Irvine, CA (US); Yiliu Wang, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 993 days.

(21) Appl. No.: 17/454,681

(22) Filed: Nov. 12, 2021

(65) Prior Publication Data
US 2022/0209743 A1    Jun. 30, 2022

Related U.S. Application Data

(60) Provisional application No. 63/132,009, filed on Dec. 30, 2020.

(51) Int. Cl.
 *H03H 9/17* (2006.01)
 *H03H 9/02* (2006.01)
 *H03H 9/56* (2006.01)

(52) U.S. Cl.
 CPC ........ *H03H 9/178* (2013.01); *H03H 9/02015* (2013.01); *H03H 9/56* (2013.01)

(58) Field of Classification Search
 CPC ........ H03H 9/582; H03H 9/564; H03H 9/175; H03H 9/02228; H03H 9/56; H03H 9/02015; H03H 9/178
See application file for complete search history.

(56) References Cited

U.S. PATENT DOCUMENTS

| | | | |
|---|---|---|---|
| 6,975,183 B2 * | 12/2005 | Aigner | H03H 9/0095 29/25.35 |
| 8,018,303 B2 | 9/2011 | Handtmann et al. | |
| 8,673,121 B2 | 3/2014 | Larson, III et al. | |
| 8,796,904 B2 | 8/2014 | Burak et al. | |
| 9,243,316 B2 | 1/2016 | Larson, III et al. | |
| 9,450,561 B2 | 9/2016 | Choy et al. | |
| 9,679,765 B2 | 6/2017 | Larson, III et al. | |
| 9,922,809 B2 | 3/2018 | McCarron et al. | |
| 10,063,210 B2 | 8/2018 | McCarron et al. | |
| 10,541,662 B2 | 1/2020 | McCarron et al. | |
| 10,541,663 B2 | 1/2020 | McCarron et al. | |
| 10,574,204 B2 | 2/2020 | McCarron et al. | |
| 11,671,074 B2 * | 6/2023 | Matsuo | H03H 9/13 310/349 |

(Continued)

OTHER PUBLICATIONS

Larson III et al., "Characterization of reversed c-axis AlN thin films", Oct. 2010.

*Primary Examiner* — J. San Martin
(74) *Attorney, Agent, or Firm* — Knobbe, Martens, Olson & Bear, LLP

(57) ABSTRACT

Aspects of this disclosure relate to an acoustic wave device with a plurality of piezoelectric layers positioned laterally relative to each other between two electrodes. One of the piezoelectric layers has a different property than another of the piezoelectric layers. Examples of the different property include c-axis orientation, doping concentration, dopant material, and piezoelectric material. At least part of each of the piezoelectric layers can be in a main acoustically active region of the acoustic wave device.

20 Claims, 18 Drawing Sheets

(56) References Cited

U.S. PATENT DOCUMENTS

| | | | |
|---|---|---|---|
| 12,063,864 B2* | 8/2024 | Arakawa | H10N 30/302 |
| 2013/0106248 A1* | 5/2013 | Burak | H03H 9/173 |
| | | | 310/360 |
| 2018/0013401 A1* | 1/2018 | Lee | H03H 9/173 |
| 2021/0021255 A1* | 1/2021 | Ballandras | H03H 9/145 |
| 2021/0079515 A1 | 3/2021 | Deniz et al. | |
| 2024/0032429 A1* | 1/2024 | Ng | H10N 30/853 |

* cited by examiner

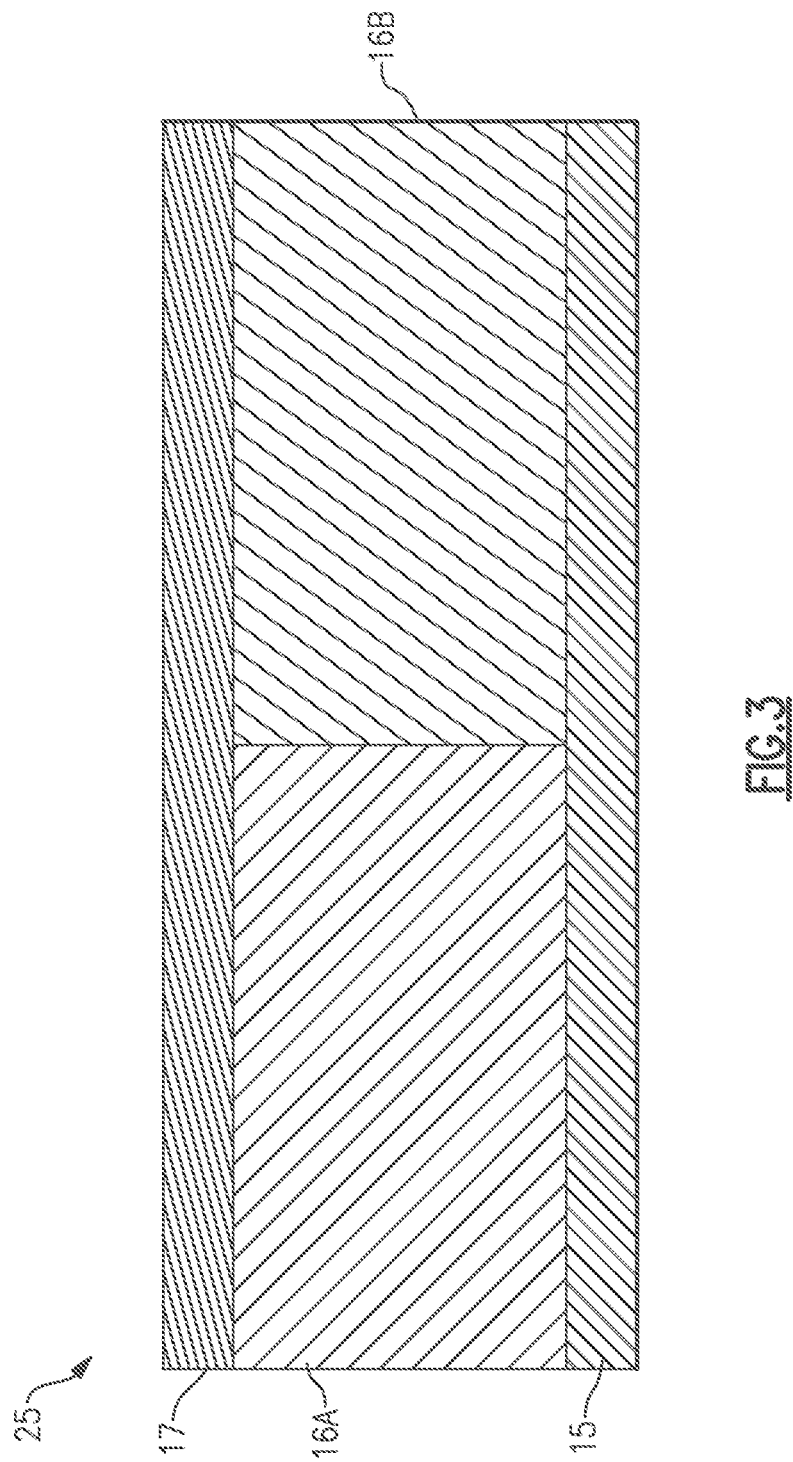

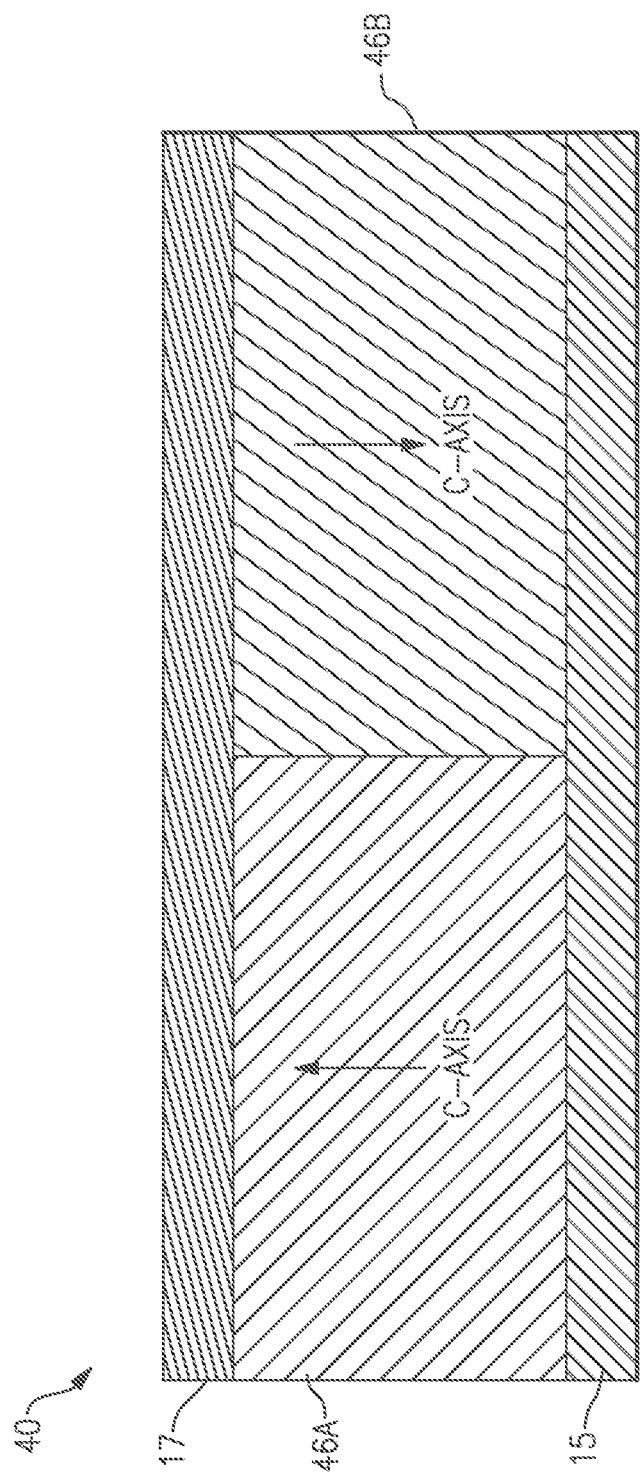

ACOUSTIC WAVE DEVICE HAVING MULTIPLE PIEZOELECTRIC LAYERS BETWEEN ELECTRODES

CROSS REFERENCE TO PRIORITY APPLICATION

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/132,009, filed Dec. 30, 2020 and titled "ACOUSTIC WAVE DEVICE HAVING MULTIPLE PIEZOELECTRIC LAYERS BETWEEN ELECTRODES," the disclosure of which is hereby incorporated by reference in its entirety and for all purposes.

BACKGROUND

Technical Field

Embodiments of this disclosure relate to acoustic wave devices with at least two piezoelectric layers.

Description of Related Technology

An acoustic wave filter can include a plurality of resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and BAW solidly mounted resonators (SMRs). In BAW resonators, acoustic waves propagate in a bulk of a piezoelectric layer.

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer.

Strong out of band rejection for acoustic wave band pass filters is typically desirable. Suppressing non-linearities in acoustic wave filters that include BAW resonators can be desirable.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an acoustic wave device with multiple piezoelectric layers. The acoustic wave device includes a first electrode, a second electrode, and a plurality of piezoelectric layers positioned laterally relative to each other. The plurality of piezoelectric layers are positioned between the first electrode and the second electrode. The plurality of piezoelectric layers include a first piezoelectric layer and a second piezoelectric layer that has a property that is different than the first piezoelectric layer. At least part of the first piezoelectric layer and at least part of the second piezoelectric layer are in a main acoustically active region of the acoustic wave device. The acoustic wave device is configured to generate an acoustic wave propagating in the plurality of piezoelectric layers.

The property can be c-axis orientation. A c-axis of the first piezoelectric layer can be oriented in an opposite direction relative to a c-axis of the second piezoelectric layer. A c-axis of the first piezoelectric layer can be tilted at an acute angle relative to a c-axis of the second piezoelectric layer. A c-axis of the first piezoelectric layer can be tilted at an obtuse angle relative to a c-axis of the second piezoelectric layer.

Second harmonic distortion generated by the second piezoelectric layer can substantially cancel second harmonic distortion generated by the first piezoelectric layer.

The property can be doping concentration. The property can be dopant material. The property can be piezoelectric material.

The first piezoelectric layer can be in physical contact with the first electrode and the second electrode on opposing sides. The second piezoelectric layer can be in physical contact with at least the second electrode.

The plurality of piezoelectric layers can include a third piezoelectric layer positioned laterally relative to the second piezoelectric layer. The third piezoelectric layer can have a property that is different than both the first and second piezoelectric layers.

The acoustic wave device can be a film bulk acoustic wave resonator. The acoustic wave device can be a bulk acoustic wave solidly mounted resonator. The acoustic wave device can be a Lamb wave resonator.

Another aspect of this disclosure is an acoustic wave filter that includes a first acoustic wave resonator and a plurality of additional acoustic wave resonators. The first acoustic wave resonator and the plurality of additional acoustic wave resonators are together configured to filter a radio frequency signal. The first acoustic wave resonator includes a first electrode, a second electrode, and a plurality of piezoelectric layers positioned laterally relative to each other and between the first electrode and the second electrode. The plurality of piezoelectric layers include a first piezoelectric layer and a second piezoelectric layer having a different property than the first piezoelectric layer. At least part of the first piezoelectric layer and at least part of the second piezoelectric layer are in a main acoustically active region of the first acoustic wave resonator.

The first acoustic wave resonator can be configured to suppress a nonlinearity of the acoustic wave filter. The first acoustic wave resonator can be configured to suppress second harmonic distortion of the acoustic wave filter.

The acoustic wave filter can have an antenna port, and the first acoustic wave resonator can be a series resonator closest to the antenna port. Alternatively, the first acoustic wave resonator can be a shunt resonator.

The first acoustic wave resonator can have a plurality of resonant frequencies. The first acoustic wave resonator can have a plurality of anti-resonant frequencies.

The first acoustic wave resonator can include one or more suitable features disclosed herein.

Another aspect of this disclosure is a radio frequency module that includes an acoustic wave filter and a radio frequency circuit element coupled to the acoustic wave filter. The acoustic wave filter and the radio frequency circuit element are enclosed within a common package. The acoustic wave filter includes a plurality of acoustic wave resonators configured to filter a radio frequency signal. The plurality of acoustic wave resonators include a first acoustic wave resonator. The first acoustic wave resonator includes a first electrode, a second electrode, and a plurality of piezoelectric layers positioned laterally relative to each other between the first electrode and the second electrode. The plurality of piezoelectric layers include a first piezoelectric layer and a second piezoelectric layer having a different property than the first piezoelectric layer. At least part of the first piezoelectric layer and at least part of the second piezoelectric layer are in a main acoustically active region of the first acoustic wave resonator.

The radio frequency circuit element can be a radio frequency amplifier arranged to amplify a radio frequency signal. The radio frequency amplified can be a low noise amplifier. Alternatively, the radio frequency amplifier can be a power amplifier. The radio frequency module can further include a switch configured to selectively couple a terminal of the acoustic wave filter to an antenna port of the radio frequency module.

The radio frequency circuit element can be a switch configured to selectively couple the acoustic wave filter to an antenna port of the radio frequency module.

Another aspect of this disclosure is a wireless communication device that includes an acoustic wave filter in accordance with any suitable principles and advantages disclosed herein, an antenna operatively coupled to the acoustic wave filter, a radio frequency amplifier operatively coupled to the acoustic wave filter and configured to amplify a radio frequency signal, and a transceiver in communication with the radio frequency amplifier.

Another aspect of this disclosure is a method of filter a radio frequency signal. The method includes receiving a radio frequency signal at a port of an acoustic wave filter in accordance with any suitable principles and advantages disclosed herein, and filtering the radio frequency signal with the acoustic wave filter.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 3 is a cross sectional schematic diagram of a zoomed in portion of the bulk acoustic wave device of FIG. 1.

FIG. 4 is a cross sectional schematic diagram of a portion of a bulk acoustic wave device with piezoelectric layers having different c-axis orientations according to an embodiment.

DETAILED DESCRIPTION OF CERTAIN EMBODIMENTS

Figure 1:
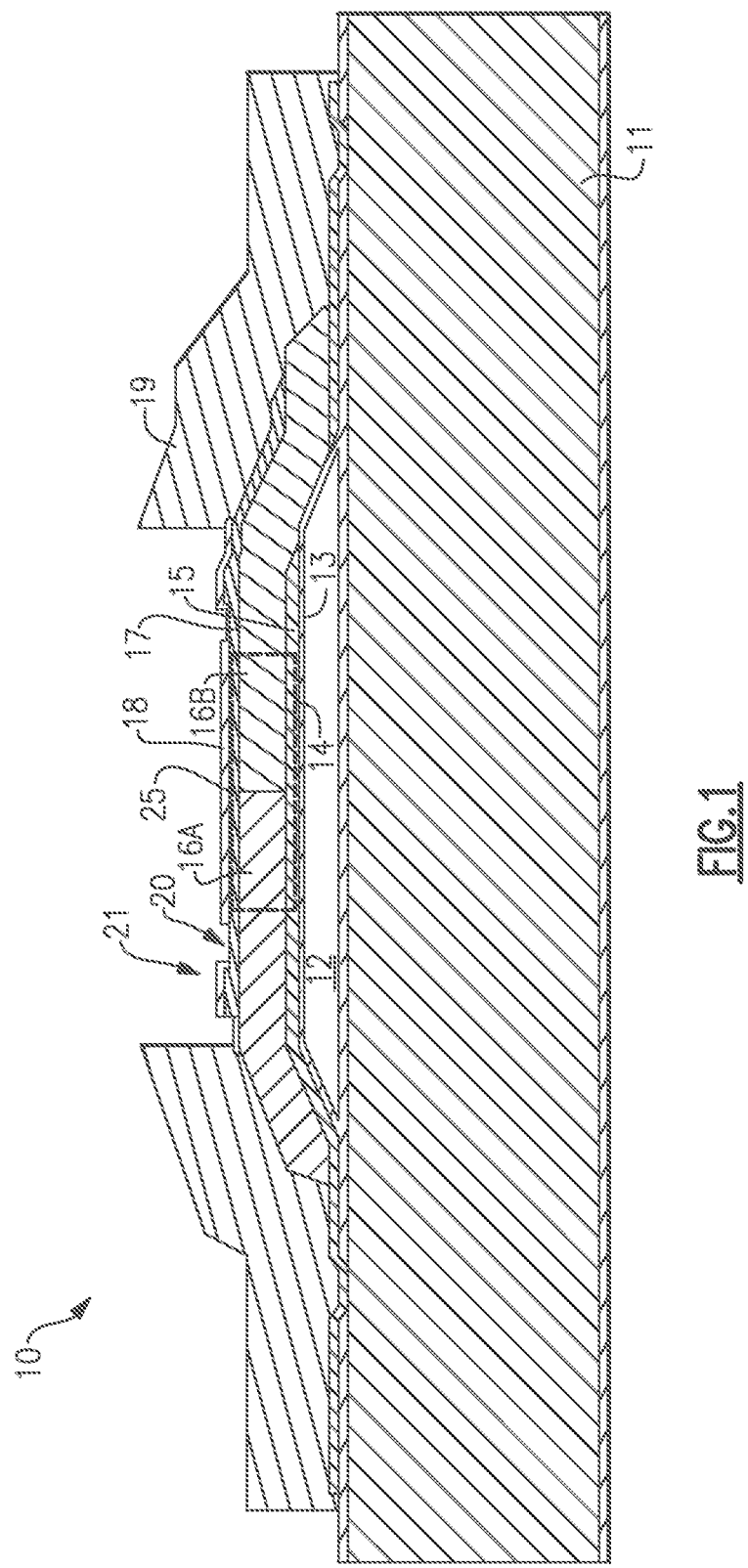
FIG. 1 is a cross sectional schematic diagram of a bulk acoustic wave device with a plurality of piezoelectric layers between electrodes according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

In bulk acoustic wave (BAW) filters, suppressing a non-linearity of a BAW resonator in higher power applications can be a technical challenge. This technical challenge can be significant in the presence of high power transmit filter signals. Emission of harmonics and/or de-sensing of a receiver section are technical problems that can be caused by nonlinearity of a BAW resonator.

A non-linearity of a BAW resonator can be suppressed by connecting two similar BAW resonators in anti-series with each other. Anti-series BAW resonators are BAW resonators that are connected in series with each other with their polarities reversed. With this connection, each of the two similar BAW resonators can generate second harmonics that have similar amplitudes and that are approximately 180° out of phase with each other. Accordingly, the second harmonic waveforms of the two similar BAW resonators connected in anti-series with each other can substantially cancel each other. Parasitics associated with the two similar BAW resonators can impact second harmonic suppression.

Filters with rejection over a relatively wide frequency range are desired for certain radio frequency (RF) systems. Acoustic wave filters can include series acoustic wave resonators and shunt acoustic wave resonators. An anti-resonant frequency of a series acoustic wave resonator can be used for rejection in an acoustic wave band pass filter. The anti-resonant frequency of the series acoustic wave resonator can create an open to thereby create a notch in a frequency response. A resonant frequency of a shunt acoustic wave resonator can be used for rejection in an acoustic wave band pass filter. The resonant frequency of the shunt acoustic wave resonator can create a short to ground to thereby create a notch in a frequency response. The series acoustic wave resonator can have its highest conductance at the resonant frequency.

To achieve a relatively wide frequency range for rejection, an acoustic wave filter can include a plurality of shunt acoustic wave resonators each having a different resonant frequency. As an example, an acoustic wave filter can include 4 or 5 shunt acoustic wave resonators each having different respective resonant frequencies. With more shunt acoustic wave resonators having different resonant frequencies, the acoustic wave filter can achieve relatively higher rejection. At the same time, an acoustic wave filter with more acoustic wave resonators can consume additional area.

Due to increasingly higher and wider rejection specifications, more than one resonant frequency and/or anti-resonant frequency can be desired for one or more BAW resonators in a filter. To achieve a plurality of resonant frequencies and/or anti-resonant frequencies of a BAW resonator, a layer stack can be adjusted and/or trimmed. Alternatively or additionally, one or more circuit elements can be electrically connected to a BAW resonator to move the resonant frequency and/or anti resonant frequency. For example, an inductor or a capacitor can be connected in parallel or series to a BAW resonator to move the resonant frequency and anti-resonant frequency. Another option is to finely tune recessed frame and/or raised frame structures such that a single BAW resonator has two or more resonant frequencies and/or anti-resonant frequencies.

Aspects of this disclosure relate to a BAW device that includes a plurality of piezoelectric layers positioned between electrodes. The multiple piezoelectric layers are positioned laterally relative to each other. By being positioned between the same two electrodes, the multiple piezoelectric layers can be connected in parallel with each other. The multiple piezoelectric layers include a first piezoelectric layer and a second piezoelectric layer, where the second piezoelectric layer has a property that is different than the first piezoelectric layer. A main acoustically active region of the BAW device can include at least part of the first piezoelectric layer and at least part of the second piezoelectric layer. Accordingly, the BAW device can generate acoustic waves that propagate in the first and second piezoelectric layers in the main acoustically acoustic region of the BAW device. A main acoustically active region of the BAW device can include at least a majority of the first piezoelectric layer and at least a majority of the second piezoelectric layer. The BAW device can be a BAW resonator in a filter.

In certain embodiments, the first piezoelectric layer and the second piezoelectric layer can have different c-axis orientations. In certain instances, the c-axes of the first and second piezoelectric layers can be oriented in opposite directions and generally perpendicular to a planar surface of at least one of the electrodes of the BAW device. In such a device, the parallel connections of the first and second piezoelectric layers can connect the first and second piezoelectric layers in anti-parallel due to the opposite orientations of the c-axes. Such a BAW device can suppress a non-linearity response excitation. For instance, second harmonic distortion can be suppressed. Embodiments disclosed herein can provide second harmonic suppression with a single BAW device. The single BAW device can consume less area than solutions for second harmonic suppression that involve two BAW devices. In some applications, a BAW device with harmonic suppression according to an embodiment can be connected in anti-series with another BAW device to provide enhanced harmonic suppression. Embodiments disclosed herein can implement second harmonic suppression with little or no additional parasitics. This can result is strong second harmonic suppression.

According to some embodiments, the first piezoelectric layer and the second piezoelectric layer can have different doping concentrations. With different doping concentrations of the first and second piezoelectric layers, the BAW device can have an additional resonance compared to a single piezoelectric layer. Embodiments disclosed herein relate to a single BAW can be implemented without additional lumped components or layer trimming. A shunt BAW resonator with multiple resonant frequencies can improve out of band rejection for a filter without significantly degrading the filter response in a pass band. With a shunt BAW resonator with multiple resonant frequencies, stringent rejection specifications can be met with fewer acoustic wave resonators than other solutions.

One or more other properties of the first piezoelectric layer can be different than the second piezoelectric layer, such as material, thickness, or the like. Moreover, the first piezoelectric layer can have two or more properties that are different than the first piezoelectric layer. The multiple piezoelectric layers can include three or more layers positioned laterally relative to each other between electrodes in certain applications.

Any suitable principles and advantages disclosed herein can be implemented in a film bulk acoustic wave resonator (FBAR), a BAW solidly mounted resonator (SMR), or a Lamb wave resonator. Any suitable principles and advantages disclosed herein can be implemented in an acoustic wave device that generates an acoustic wave in a piezoelectric layer.

Example BAW devices with a plurality of piezoelectric layers positioned between an upper electrode and a lower electrode will now be discussed. Any suitable principles and advantages of these BAW devices can be implemented together with each other.

FIG. 1 is a cross sectional diagram of a BAW device 10 with a according to an embodiment. As illustrated, the bulk acoustic wave device 10 includes a support substrate 11, an air cavity 12, a first passivation layer 13, an adhesion layer 14, a first electrode 15, a plurality of piezoelectric layers 16A and 16B, an second electrode 17, a second passivation layer 18, and an interconnect layer 19. The BAW device 10 includes a recessed frame structure 20 and a raised frame structure 21. In the BAW device 10, a piezoelectric and electrode stack 25 includes the first electrode 15, the piezoelectric layers 16A and 16B, and the second electrode 17. A zoomed in view of the piezoelectric and electrode stack 25 of the BAW device 10 is shown in FIG. 3.

In the BAW device 10, the first piezoelectric layer 16A and the second piezoelectric layer 16B are both sandwiched between the first electrode 15 and the second electrode 17. The first and second piezoelectric layers 16A and 16B are both in physical contact with a planar surface of the second electrode 17 as illustrated in FIG. 1. In some instances, the first and second piezoelectric layers 16A and 16B can both be in physical contact with a planar surface of the first electrode 15.

As illustrated, the first and second piezoelectric layers 16A and 16B are positioned laterally relative to each other. The second piezoelectric layer 16B has at least one property that is different than the first piezoelectric layer 16A. More details regarding the first and second piezoelectric layers 16A and 16B will be discussed with reference to FIG. 3. The first piezoelectric layer 16A can include aluminum nitride. The second piezoelectric layer 16B can include aluminum nitride. The first piezoelectric layer 16A and/or the second piezoelectric layer can include any suitable piezoelectric material. The first piezoelectric layer 16A and/or the second piezoelectric layer can be doped with any suitable dopant.

An active region or active domain of the BAW device 10 can be defined by a portion of a piezoelectric layers 16A and 16B that is in contact with both the first electrode 15 and the second electrode 17 and overlaps an acoustic reflector, such as the air cavity 12 or a solid acoustic mirror. The active region corresponds to where voltage is applied on opposing sides of the piezoelectric layer 16A and 16B over the acoustic reflector. The active region can be the acoustically active region of the BAW device 10. The BAW device 10 also includes a recessed frame region with the recessed frame structure 20 in the active region and a raised frame region with the raised frame structure 21 in the active region. A main acoustically active region can be the central part of the active region that is free from the frame structures 20 and 21. The main acoustically active region can include most of the first piezoelectric layer 16A and most of the second piezoelectric layer 16B.

While the BAW device 10 includes the recessed frame structure 20 and the raised frame structure 21, other frame structures can alternatively or additionally be implemented. For example, a raised frame structure with multiple layers including a layer between an electrode of a BAW device and a piezoelectric layer can be implemented. As another example, a floating raised frame structure can be implemented. As one more example, a raised frame structure can be implemented without a recessed frame structure. In some instances, a BAW device does not include a frame structure. Such a BAW devices can include multiple piezoelectric layers between electrodes in accordance with any suitable principles and advantages disclosed herein.

The air cavity 12 is an example of an acoustic reflector. As illustrated, the air cavity 12 is located above the support substrate 11. The air cavity 12 is positioned between the support substrate 11 and the first electrode 15. In some applications, an air cavity can be etched into a support substrate. The support substrate 11 can be a silicon substrate. The support substrate 11 can be any other suitable support substrate. The electrical interconnect layer 19 can electrically connect electrodes of the BAW device 10 to one or more other BAW devices, one or more other circuit elements, one or more signal ports, the like, or any suitable combination thereof.

The first passivation layer 13 is positioned between the air cavity 12 and the first electrode 15 in the BAW device 10. The first passivation layer 13 can be referred to as a lower passivation layer. The first passivation layer 13 can be a silicon dioxide layer or any other suitable passivation layer, such as aluminum oxide, silicon carbide, aluminum nitride, silicon nitride, silicon oxynitride, or the like. As shown in FIG. 1, an adhesion layer 14 can be positioned between the first passivation layer 13 and the first electrode 15 to increase adhesion between these layers. The adhesion layer 14 can be a titanium layer, for example.

The first electrode 15 can be referred to as a lower electrode. The first electrode 15 can have a relatively high acoustic impedance. The first electrode 15 can include molybdenum (Mo), tungsten (W), ruthenium (Ru), chromium (Cr), iridium (Ir), platinum (Pt), Ir/Pt, or any suitable alloy and/or combination thereof. Similarly, the second electrode 17 can have a relatively high acoustic impedance. The second electrode 17 can include Mo, W, Ru, Cr, Ir, Pt, Ir/Pt, or any suitable alloy and/or combination thereof. The second electrode 17 can be formed of the same material as the first electrode 15 in certain instances. The second electrode 17 can be referred to as an upper electrode. The thickness of the first electrode 15 can be approximately the same as the thickness of the second electrode 17 in the main acoustically active region of the BAW device 10. The first electrode 15 and the second electrode 17 can be the only electrodes of the BAW device 10.

The second passivation layer 18 can be referred to as an upper passivation layer. The second passivation layer 18 can be a silicon dioxide layer or any other suitable passivation layer, such as aluminum oxide, silicon carbide, aluminum nitride, silicon nitride, silicon oxynitride, or the like. The second passivation layer 18 can be the same material as the first passivation layer 13 in certain instances.

Figure 2A:
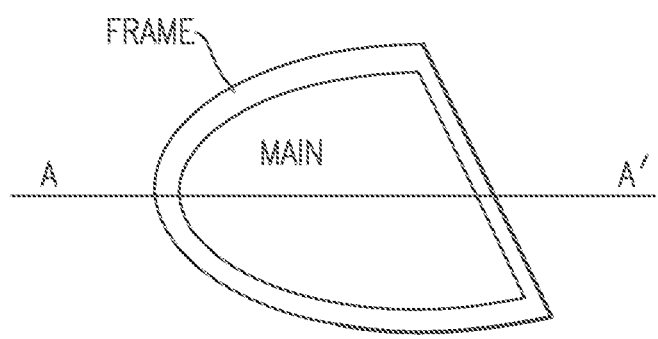
FIG. 2A is an example plan view of the bulk acoustic wave device of FIG. 1.
Figure 2B:
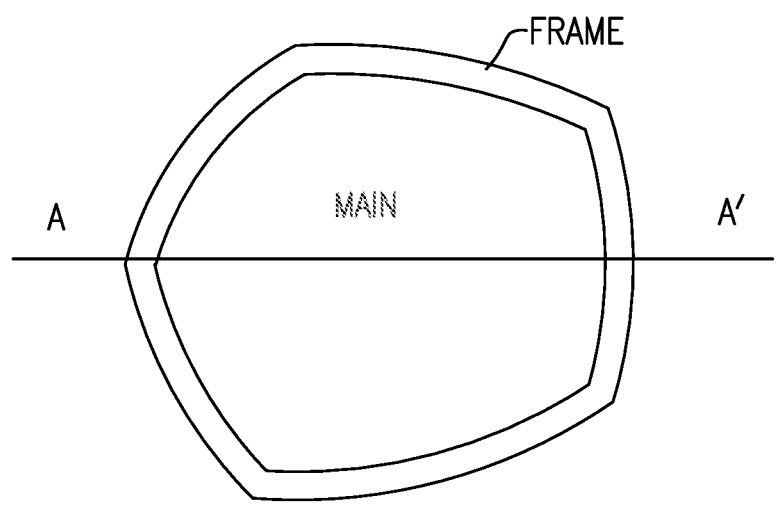
FIG. 2B is another example plan view of the bulk acoustic wave device of FIG. 1.

FIGS. 2A and 2B are example plan views of the BAW device 10 of FIG. 1. Any other BAW devices disclosed herein can be implemented with the same or a similar shape to the BAW device 10 in plan view. The cross-sectional view of FIG. 1 is along the line from A to A' in FIG. 2A or FIG. 2B. In FIGS. 2A and 2B, the frame region FRAME and the main acoustically active region MAIN are shown. As illustrated, the main acoustically active region MAIN can correspond be the majority of the area of the BAW device 10. The main acoustically active region MAIN can be more to scale in FIGS. 2A and 2B than in FIG. 1. FIG. 2A illustrates the BAW device 10 with a semi-elliptical shape in plan view. FIG. 2B illustrates the BAW device 10 with a pentagon shape with curved sides in plan view. A BAW device in accordance with any suitable principles and advantages disclosed herein can have any other suitable shape in plan view, such as a quadrilateral shape, a quadrilateral shape with curved sides, a semi-circular shape, a circular shape, or ellipsoid shape.

FIG. 3 includes a schematic cross-sectional view of the piezoelectric and electrode stack 25 of the BAW device 10 of FIG. 1. The illustrated part of piezoelectric and electrode stack 25 is located in the main acoustically active region of the BAW device 10. The piezoelectric and electrode stack 25 of FIG. 3 includes the first electrode 15, the first piezoelectric layer 16A, the second piezoelectric layer 16B, and the second electrode 17.

The second piezoelectric layer 16B has at least one property that is different than the first piezoelectric layer 16A. The different property can be any suitable property that results in increased suppression of a non-linearity in the BAW device 10. The different property can be any suitable property that contributes to the BAW device 10 having a second resonant frequency and/or anti-resonant frequency.

Examples of the different property include without limitation a c-axis orientation, a doping concentration, a dopant material, a piezoelectric layer material, or a thickness. The second piezoelectric layer 16B can have a different c-axis orientation than the first piezoelectric layer 16A. The second piezoelectric layer 16B can have a different doping concentration than the first piezoelectric layer 16A. The second piezoelectric layer 16B can be doped with a different dopant than the first piezoelectric layer 16A. The second piezoelectric layer 16B can have a different piezoelectric material than the first piezoelectric layer 16A. For instance, the first piezoelectric layer 16A can include aluminum nitride (AlN) and the second piezoelectric layer 16B can include zinc oxide (ZnO). The second piezoelectric layer 16B can have a different thickness than the first piezoelectric layer 16A. In some instances, the second piezoelectric layer 16B has two or more properties that are different than the first piezoelectric layer 16A. As one example, the second piezoelectric layer 16B can have a different c-axis orientation and a different doping concentration than the first piezoelectric layer 16A.

The different property can cause a change in one or more material parameters (e.g., $c_{33}$, $e_{33}$ and/or $\varepsilon_{33}$) of a piezoelectric layer. Doping concentration and c-axis orientation are properties that can change resonant frequency and/or anti-resonant frequency of a BAW device. One or more of $c_{33}$, $e_{33}$ or $\varepsilon_{33}$ can be changed by adjusting one or more of c-axis orientation, doping concentration, or material of piezoelectric layer. This can cause a resonant frequency and/or resonant frequency to change. Accordingly, piezoelectric layers with one or more different material parameters can have different resonant frequencies and/or anti-resonant frequencies.

In certain applications, a combination of c-axis orientation and doping concentration can be adjusted in one piezoelectric layer relative to another piezoelectric layer such that a BAW device has two distinct resonant frequencies and one anti-resonant frequency. In some applications, a combination of c-axis orientation and doping concentration can be adjusted in one piezoelectric layer relative to another piezoelectric layer such that a BAW device has two distinct anti-resonant frequencies and one resonant frequency. Two or more properties of a piezoelectric layer can be adjusted such that a BAW device with multiple piezoelectric layers can have a single resonant frequency and also have a plurality of anti-resonant frequencies. Two or more properties of a piezoelectric layer can be adjusted such that a BAW device with multiple piezoelectric layers can have a single anti-resonant frequency and also have a plurality of resonant frequencies. Adjusting the two or more properties in one piezoelectric layer can align a resonance (e.g., resonant frequency or anti-resonant frequency) of the one piezoelectric layer with a resonance of another piezoelectric layer that is generally similar except for the adjusted properties. At the same time, another resonance (e.g., anti-resonant frequency or resonant frequency) can be distinct between the piezoelectric layers.

The first piezoelectric layer 16A can be approximately the same size as the second piezoelectric layer 16B. Accordingly, the first piezoelectric layer 16A and the second piezoelectric layer 16B can have an approximately 50/50 ratio in a main acoustically active region of the BAW device 10. The first piezoelectric layer 16A and the second piezoelectric layer 16B can have any suitable relative sizes for a particular application. For instance, the first piezoelectric layer 16A and the second piezoelectric layer 16B can have an approximately 60/40 ratio in a main acoustically active region of a BAW device in certain applications. The ratio of the first piezoelectric layer 16A and the second piezoelectric layer 16B can be selected based on parasitics associated with a BAW device that includes the piezoelectric layers 16A and 16B. For example, relative sizes of the piezoelectric layers 16A and 16B can be selected to provide stronger suppression of a non-linearity in the presence of parasitics that impact the piezoelectric layers 16A and 16B.

Other embodiments of piezoelectric and electrode stacks of BAW devices with a plurality of laterally positioned piezoelectric layers between electrodes will be discussed with reference to example cross sections shown in FIGS. 4 to 9. These piezoelectric and electrode stacks can be implemented in place of the piezoelectric and electrode stack 25 of FIGS. 1 and 3. The piezoelectric and electrode stacks shown in FIGS. 4 and 9 can be over an acoustic reflector in a main acoustically active region of a BAW device. Any suitable combination of features of piezoelectric and electrode stacks of FIGS. 3 to 9 can be combined with each other. The example piezoelectric and electrode stacks of FIGS. 4 to 7 include piezoelectric layers with different c-axis orientations. The example piezoelectric and electrode stacks of FIGS. 8 and 9 include piezoelectric layers with different doping concentrations.

FIG. 4 illustrates a schematic cross-sectional view of a piezoelectric and electrode stack 40 of a BAW device. The piezoelectric and electrode stack 40 can be implemented in a main acoustically active region of a BAW device. In the piezoelectric and electrode stack 40, a first piezoelectric layer 46A has a c-axis orientation that is opposite to a c-axis orientation of a second piezoelectric layer 46B.

During manufacturing, a seed layer can be formed over part of the first electrode 15 over which the second piezoelectric layer 46B is subsequently formed while the part of the first electrode 15 over which the first piezoelectric layer 46A is subsequently formed is free from the seed layer. The seed layer can cause the second piezoelectric layer 46B to have an opposite orientation than the first piezoelectric layer 46A. The seed layer can be an aluminum layer when the first piezoelectric layer 46B is an aluminum nitride layer, for example.

As illustrated in FIG. 4, the c-axis of the first piezoelectric layer 46A is generally perpendicular to a planar surface of the first electrode 15. The c-axis of the second piezoelectric layer 46B is generally perpendicular to a planar surface of the first electrode 15 in FIG. 4 and pointing in an opposite direction relative to the c-axis of the first piezoelectric layer 46B. Other than the different c-axis orientations and positions in a BAW device, the first piezoelectric layer 46A and the second piezoelectric layer 46B can be generally similar or the same as each other form a physical standpoint.

With the piezoelectric layers 46A and 46B being positioned lateral to each other and connected in parallel with each other in a main acoustically active region of the BAW device, the piezoelectric layers 46A and 46B can generate second harmonics having similar amplitudes and that are approximately 180° out of phase with each other. Accordingly, the second harmonics generated by the piezoelectric layers 46A and 46B can substantially cancel each other. Thus, second harmonic distortion can be suppressed in a BAW device with the piezoelectric and electrode stack 40. One or more other non-linearities can alternatively or additionally be suppressed by two or more laterally positioned and parallel connected piezoelectric layers of a single BAW device.

Figure 5:
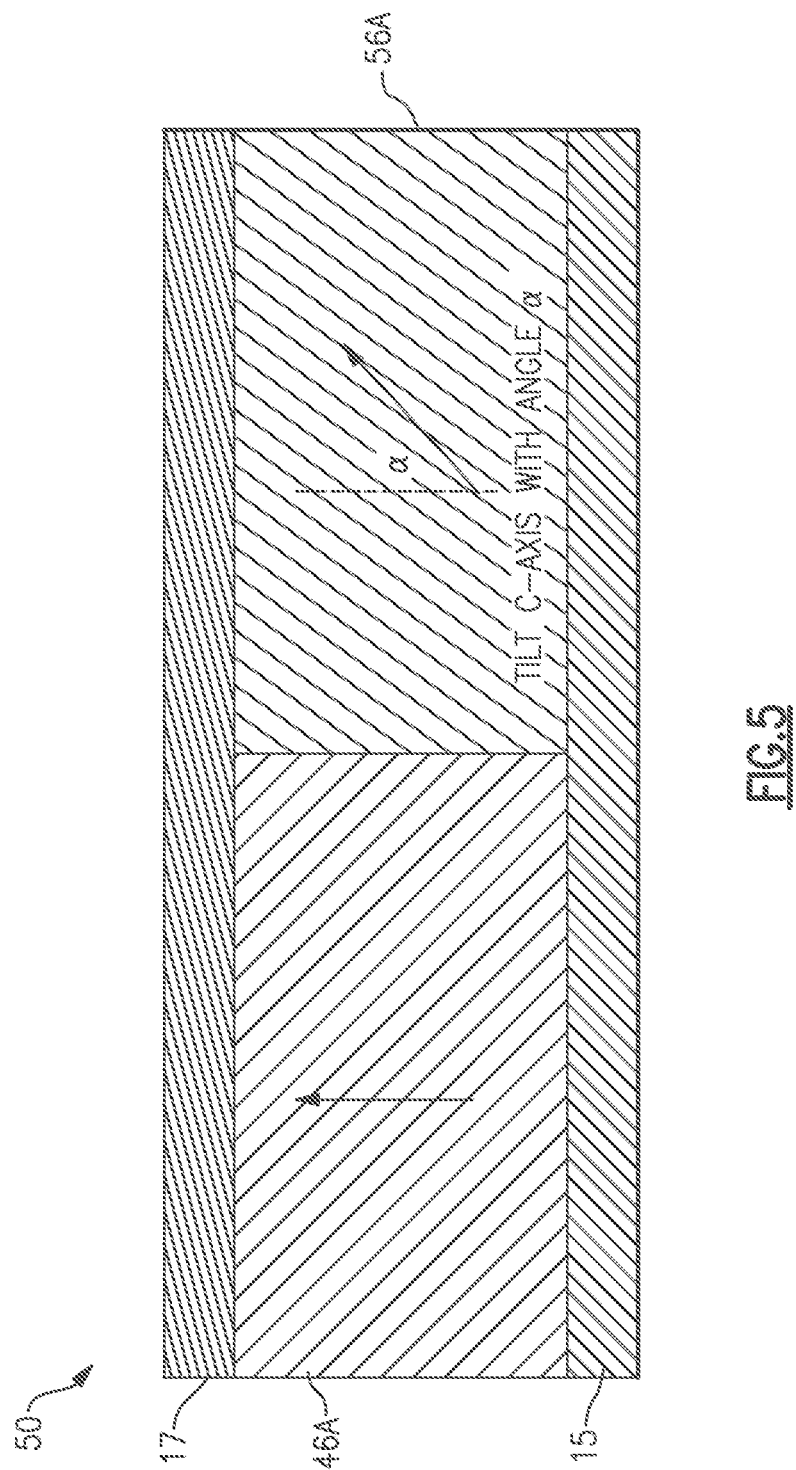
FIG. 5 is a cross sectional schematic diagram of a portion of a bulk acoustic wave device with piezoelectric layers having different c-axis orientations according to another embodiment.

FIG. 5 illustrates a schematic cross-sectional view of a piezoelectric and electrode stack 50 of a BAW device. The piezoelectric and electrode stack 50 is like the piezoelectric and electrode stack 40 of FIG. 4, except that a second piezoelectric layer 56A has a c-axis that is titled at an angle α relative to the an axis perpendicular to a planar surface of the first electrode 15 that is below the piezoelectric layers 46A and 56A. The angle α can be any suitable non-zero angle. The angle α can be an acute angle. The second piezoelectric layer 56A with the c-axis titled at an acute angle α can have a lower acoustic velocity than the first piezoelectric layer 46A. This can result in a lower resonant frequency associated with the second piezoelectric layer 56A than a resonant frequency associated with the first piezoelectric layer 46A. The angle α can be an obtuse angle. The angle α can be a right angle. In the piezoelectric and electrode stack 50, the different c-axis orientations of the piezoelectric layers 46A and 56A can impact a frequency response of a BAW device that includes the piezoelectric and electrode stack 50. A c-axis can be tilted using any suitable method known in the art.

Figure 6:
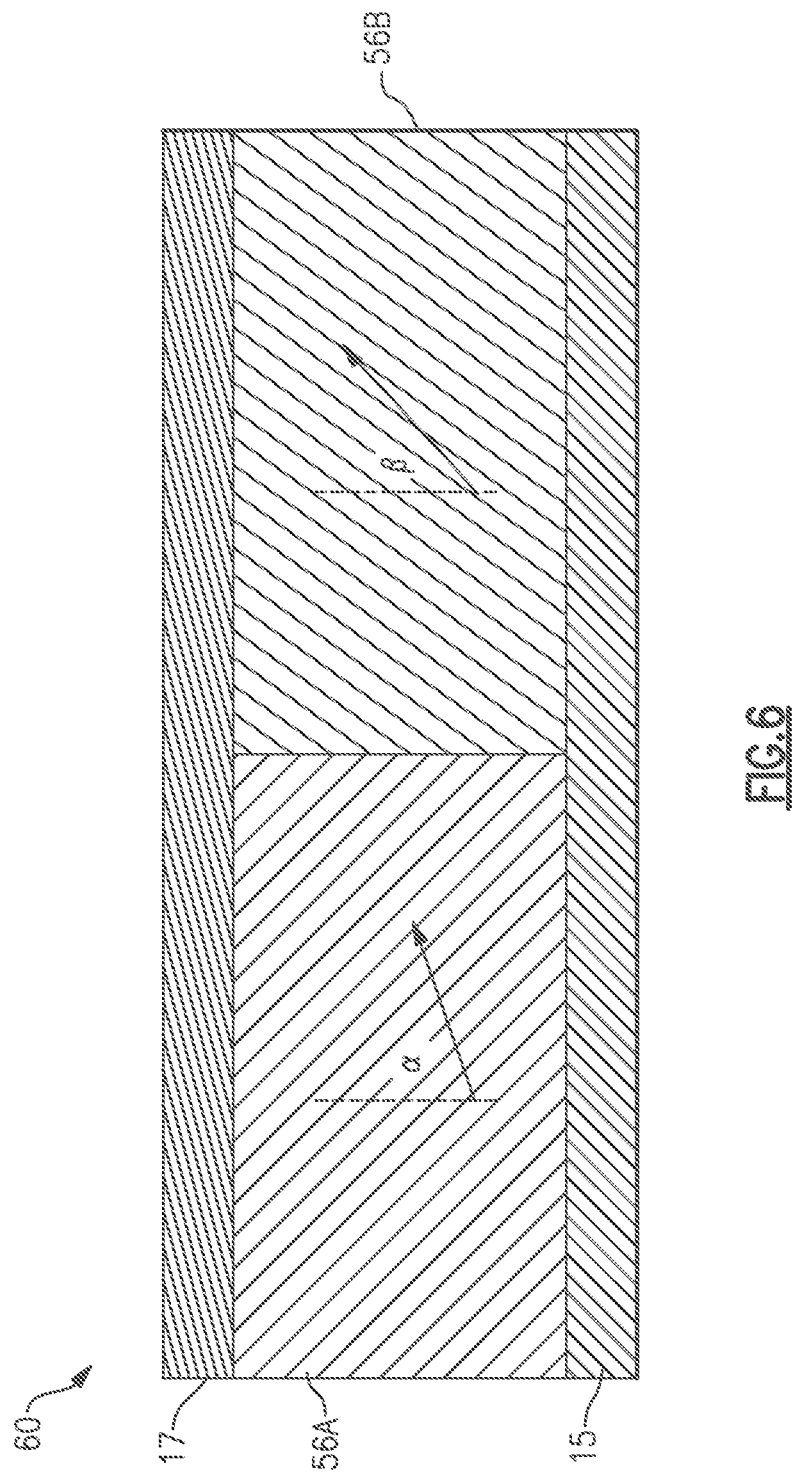
FIG. 6 is a cross sectional schematic diagram of a portion of a bulk acoustic wave device with piezoelectric layers having different c-axis orientations according to another embodiment.

FIG. 6 illustrates a schematic cross-sectional view of a piezoelectric and electrode stack 60 of a BAW device. The piezoelectric and electrode stack 60 is like the piezoelectric and electrode stack 50 of FIG. 5, except that a second piezoelectric layer 56B has a c-axis that is tilted at an angle β relative to the an axis perpendicular to a planar surface of the first electrode 15 that is in contract with the piezoelectric layers 56A and 56B. The angle β can be any suitable non-zero angle. The angle β can be an acute angle. The angle β can be an obtuse angle. The piezoelectric and electrode stack 60 illustrates that two piezoelectric layers 56A and 56B can have tilted c-axes. The angles α and β can be different from each other. For example, the angles α and β can be 180° offset from each other. The angles α and β can approximately the same as each other.

Figure 7:
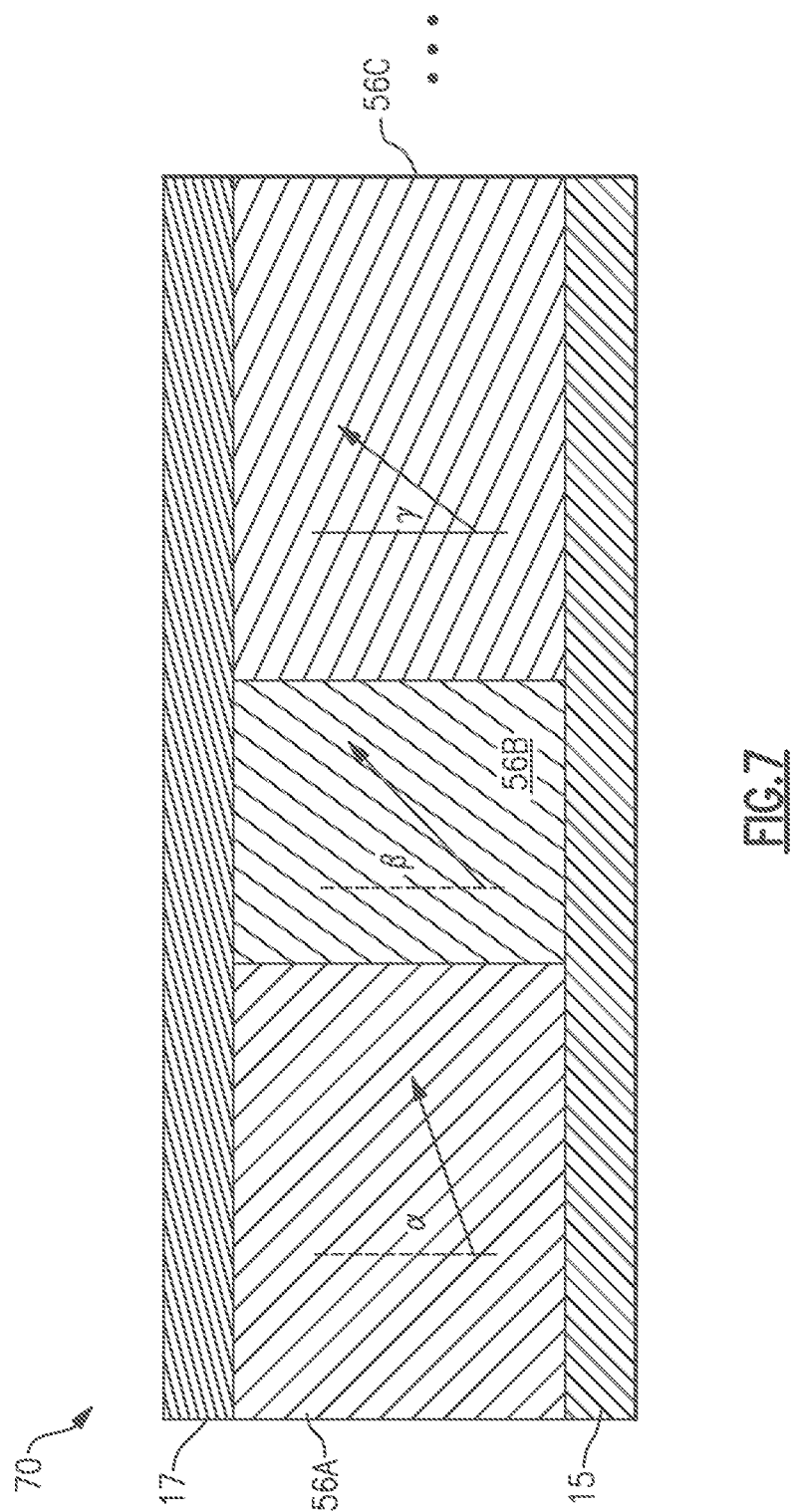
FIG. 7 is a cross sectional schematic diagram of a portion of a bulk acoustic wave device with piezoelectric layers having at least three different c-axis orientations according to another embodiment.
Figure 8:
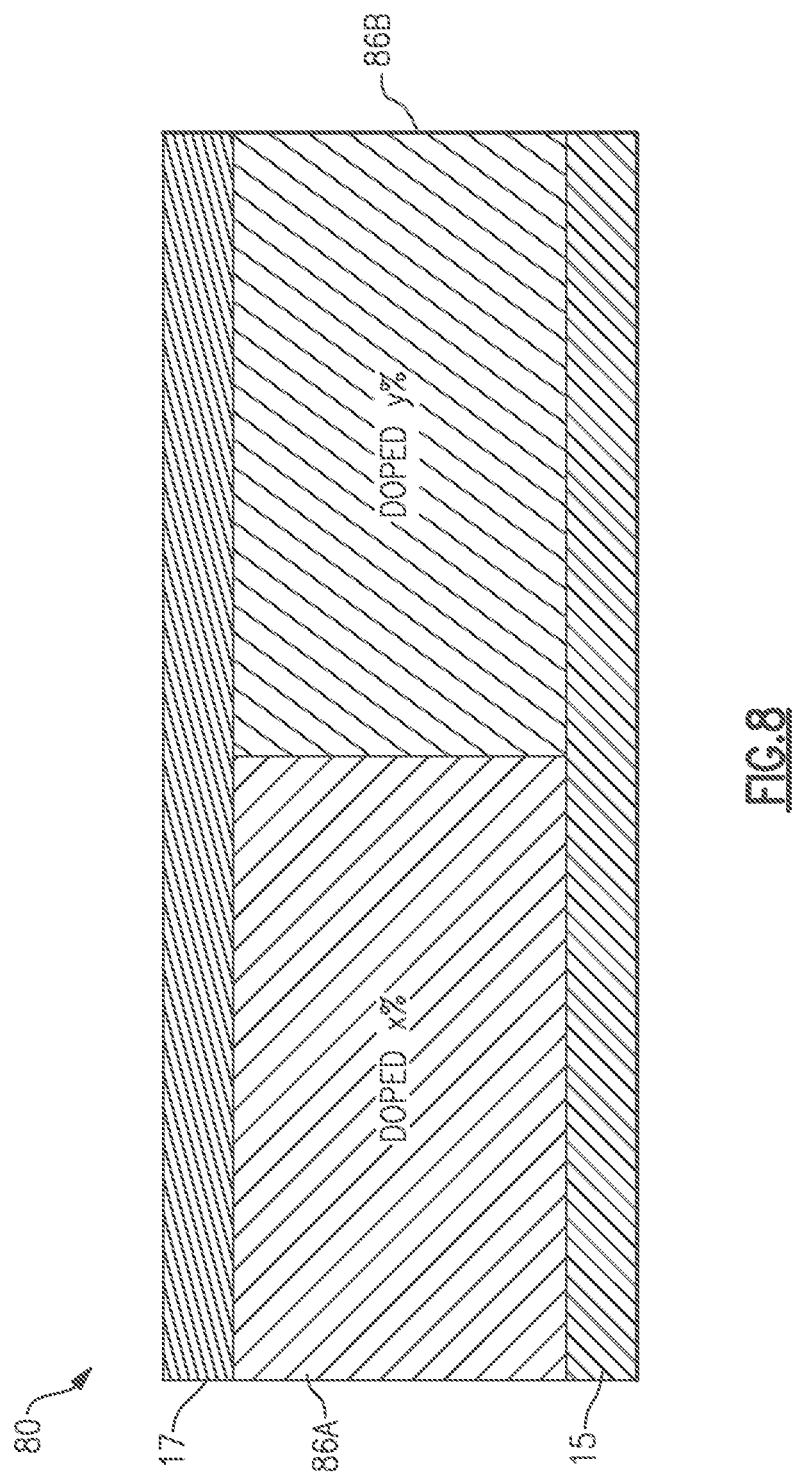
FIG. 8 is a cross sectional schematic diagram of a portion of a bulk acoustic wave device with piezoelectric layers having different doping concentrations according to an embodiment.
Figure 9:
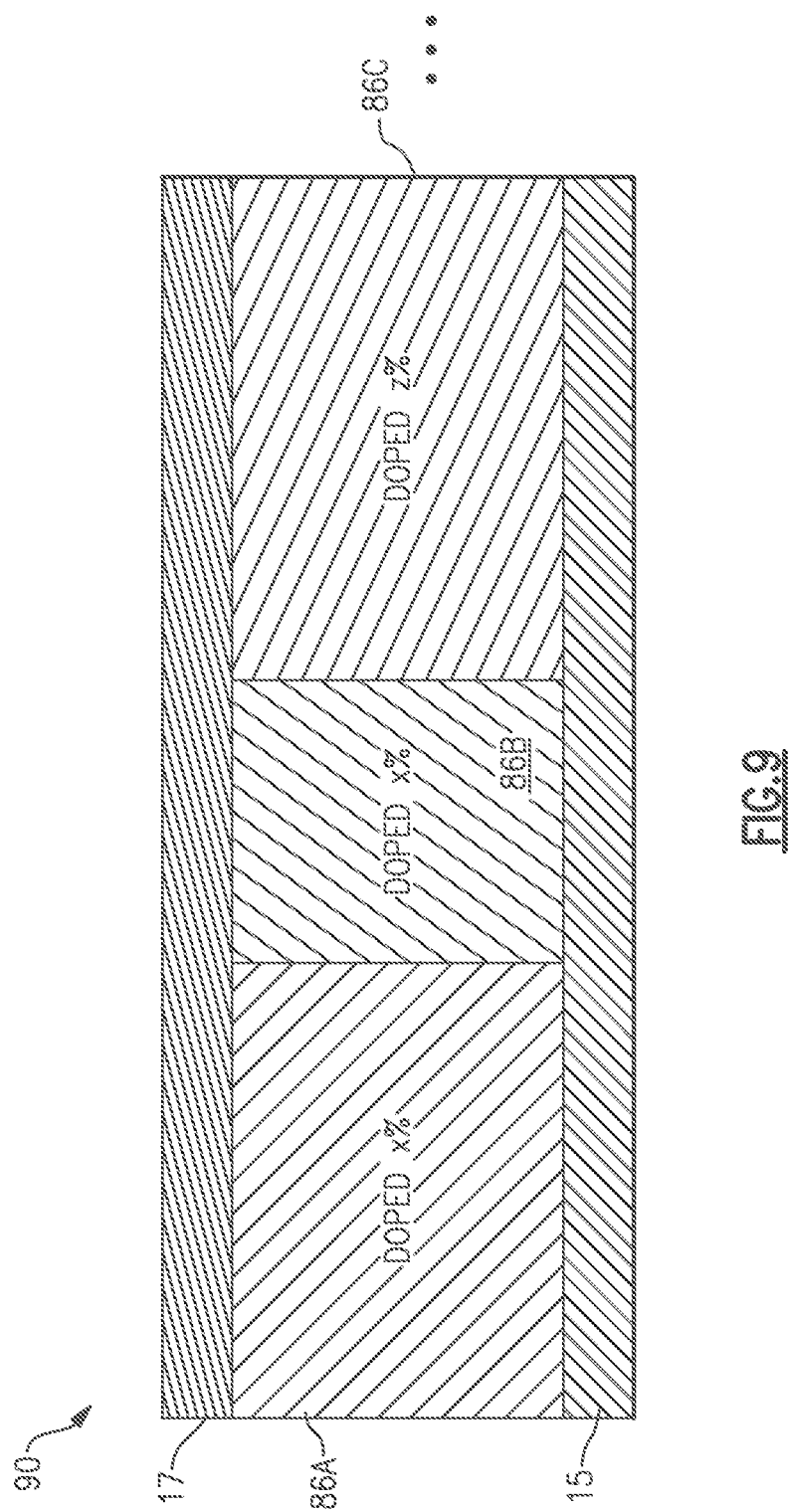
FIG. 9 is a cross sectional schematic diagram of a portion of a bulk acoustic wave device with piezoelectric layers having at least three different doping concentrations according to another embodiment.

FIG. 7 illustrates a schematic cross-sectional view of a piezoelectric and electrode stack 70 of a BAW device. The piezoelectric and electrode stack 70 is like the piezoelectric and electrode stack 60 of FIG. 6, except that three piezoelectric layers 56A, 56B, and 56C each have different c-axis orientations. The third piezoelectric layer 56C can have a c-axis tilted by an angle γ. FIG. 7 illustrates that any suitable number of three or more piezoelectric layers each having a different c-axis orientations can be positioned laterally from each other and between two electrodes of a single BAW device. Three or more piezoelectric layers 56A, 56B, and 56C can be used to suppress two or more non-linearities in certain applications. Alternatively or additionally, three or more piezoelectric layers 56A, 56B, and 56C can generate three or more difference resonances in various applications A piezoelectric layer of a BAW device can be doped with a dopant. Example dopants include scandium (Sc), chromium (Cr), magnesium (Mg), calcium (Ca), yttrium (Y), or the like. Some dopants include compounds of at least one of the example dopants and one or more other elements. FIGS. 8 and 9 illustrate portions of BAW devices with piezoelectric layers that have different doping concentrations. The different doping concentrations of the piezoelectric layers can generate one or more additional resonances (e.g., resonant frequency and/or anti-resonant frequency) compared to a BAW device with a single piezoelectric layer having a generally constant doping concentration. With increased Sc doping, an electromechanical coupling coefficient $k^2$ can be increased and there can be larger difference between a resonant frequency and anti-resonant frequency.

For example, a BAW device with a plurality of piezoelectric layers with different doping concentrations positioned laterally from each other and between two electrodes of a single BAW device can generate at least two distinct resonant frequencies. A difference between the two resonant frequencies can be at least 1 megahertz (MHz) in certain instances. In some instances, a difference between the two resonant frequencies can be at least 5 MHz. A second resonant frequency can be in a range from 0.9 to 1.1 times a first resonant frequency. A higher of the two resonant frequencies can be between a lower of the resonant frequencies and a band edge of a pass band of an acoustic wave band pass filter that includes the BAW device with the two resonant frequencies. The two resonant frequencies can be created by the different piezoelectric layers can both impact the pass band of the filter. The two resonant frequencies can be created by different laterally positioned piezoelectric layers of a BAW device having one or more different properties in accordance with any suitable principles and advantages disclosed herein.

As another example, a BAW device with a plurality of piezoelectric layers with different doping concentrations positioned laterally from each other and between two electrodes of a single BAW device can generate at least two distinct anti-resonant frequencies. A difference between the two anti-resonant frequencies can be at least 1 megahertz (MHz) in certain instances. In some instances, a difference between the two anti-resonant frequencies can be at least 5 MHz. A second anti-resonant frequency can be in a range from 0.9 to 1.1 times a first anti-resonant frequency. A lower of the two resonant frequencies can be between a higher of the resonant frequencies and a band edge of a pass band of an acoustic wave band pass filter that includes the BAW device with the two anti-resonant frequencies. The two anti-resonant frequencies can be created by the different piezoelectric layers can both impact the pass band of the filter. The two anti-resonant frequencies can be created by different laterally positioned piezoelectric layers of a BAW device having one or more different properties in accordance with any suitable principles and advantages disclosed herein.

FIG. 8 illustrates a schematic cross-sectional view of a piezoelectric and electrode stack 80 of a BAW device. The piezoelectric and electrode stack 80 can be implemented in a main acoustically active region of a BAW device. In the piezoelectric and electrode stack 80, a first piezoelectric layer 86A has a different doping concentration than a second piezoelectric layer 86B. The different doping concentrations of the piezoelectric layers 86A and 86B can cause different resonances in a BAW device that includes the piezoelectric and electrode stack 80. Other than the different doping concentrations and positions in a BAW device, the first piezoelectric layer 86A and the second piezoelectric layer 86B can be generally similar or the same as each other form a physical standpoint.

FIG. 9 illustrates a schematic cross-sectional view of a piezoelectric and electrode stack 90 of a BAW device. The piezoelectric and electrode stack 90 is like the piezoelectric and electrode stack 80 of FIG. 8, except that three piezoelectric layers 86A, 86B, and 86C each have different doping concentrations. FIG. 9 illustrates that any suitable number of three or more piezoelectric layers each having a different respective doping concentration can be positioned laterally from each other and between two electrodes of a single BAW device.

Figure 10:
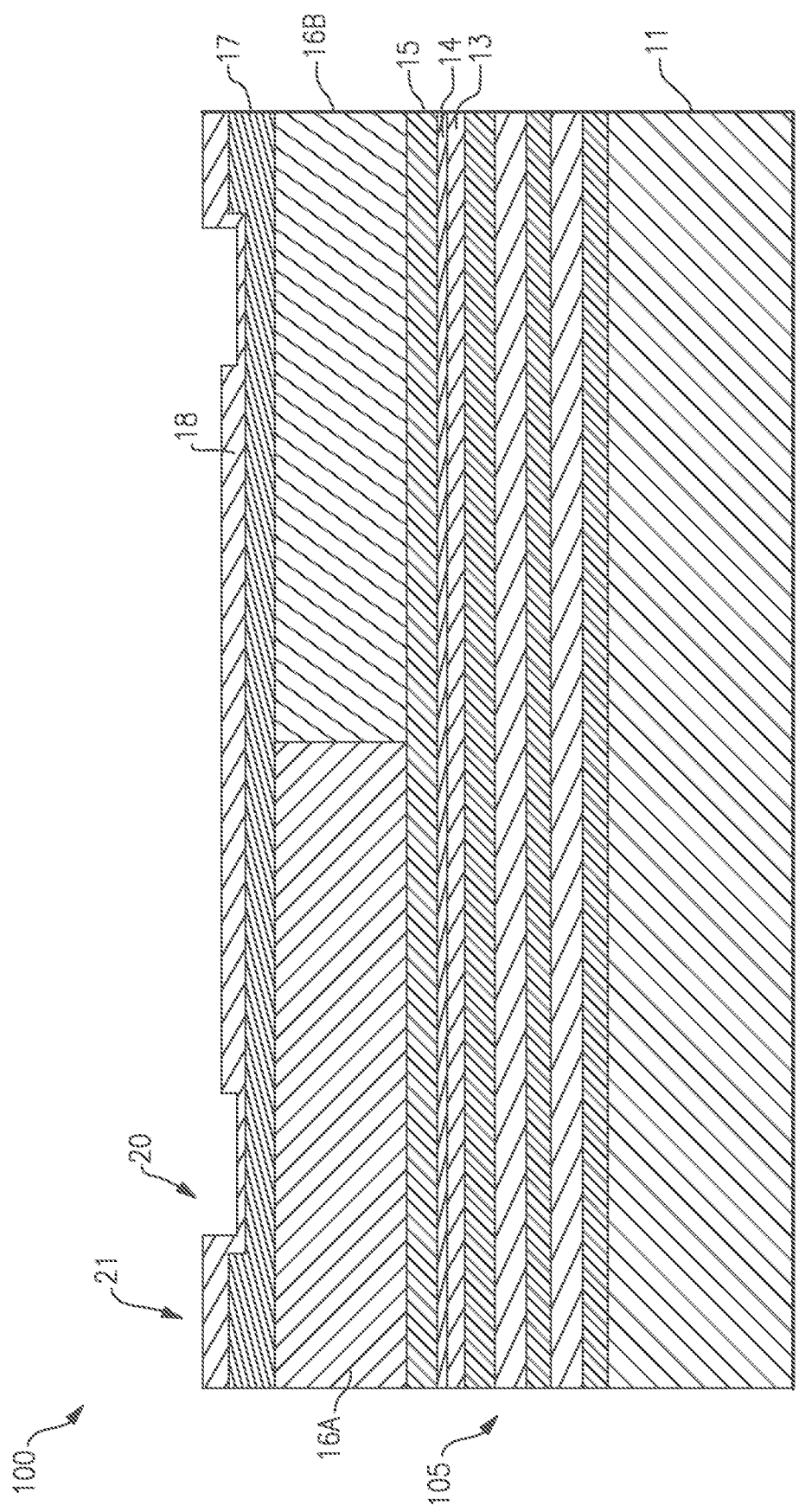
FIG. 10 is a cross sectional schematic diagram of a solidly mounted bulk acoustic wave resonator with a plurality of piezoelectric layers between electrodes according to an embodiment.

FIG. 10 is a cross sectional schematic diagram of a BAW device 100 according to an embodiment. The BAW device 100 is like the BAW device 10 of FIG. 1 except that a solid acoustic mirror 105 is included in place of an air cavity 12. The solid acoustic mirror 105 is an acoustic Bragg reflector. The solid acoustic mirror 105 includes alternating low acoustic impedance and high acoustic impedance layers. As one example, the solid acoustic mirror 105 can include alternating silicon dioxide layers as low impedance layers and tungsten layers as high impedance layers. The first passivation layer 13 can be part of the solid acoustic mirror 105 in certain applications. The BAW device is an example of a BAW solidly mounted resonator (SMR). Any suitable principles and advantages of disclosed herein can be applied in BAW SMRs.

Figure 11:
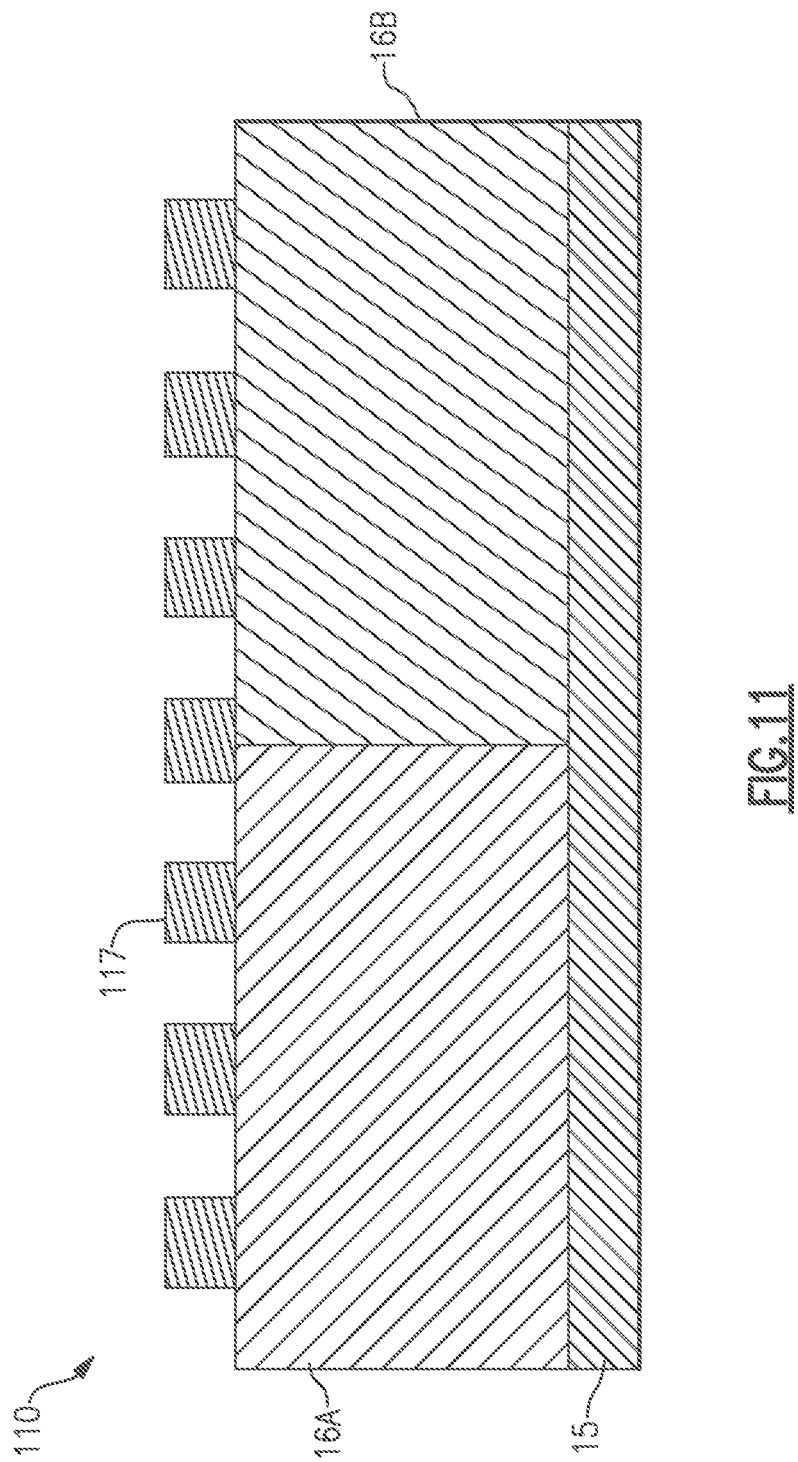
FIG. 11 is a cross sectional schematic diagram of a Lamb wave resonator with a plurality of piezoelectric layers between electrodes according to an embodiment.

FIG. 11 is a cross sectional schematic diagram of a Lamb wave resonator 110 according to an embodiment. The illustrated Lamb wave resonator 110 is similar to the piezoelectric and electrode stack 25 of FIGS. 1 and 3, except that an interdigital transducer electrode 117 is included in place of the second electrode 17. Any suitable principles and advantages of disclosed herein can be applied in Lamb wave resonators.

Bulk acoustic wave devices disclosed herein can be implemented as bulk acoustic wave resonators in a variety of filters. Such filters can be arranged to filter a radio frequency signal. Bulk acoustic wave devices disclosed herein can be implemented in a variety of different filter topologies. Example filter topologies include without limitation, ladder filters, lattice filters, hybrid ladder lattice filters, notch filters where a notch is created by a BAW resonator, hybrid acoustic and non-acoustic inductor-capacitor filters, and the like. Some such filters can be band pass filters. In some other applications, such filters include band stop filters. In some instances, bulk acoustic wave devices disclosed herein can be implemented in filters with one or more other types of resonators and/or with passive impedance elements, such as one or more inductors and/or one or more capacitors. Some example filter topologies will now be discussed with reference to FIGS. 12 to 14. Any suitable combination of features of the filter topologies of FIGS. 12 to 14 can be implemented together with each other and/or with other filter topologies.

A BAW resonator with suppression of a non-linearity, such as a second harmonic distortion, can be a series BAW resonator closest to an antenna port of an acoustic wave filter. The series BAW resonator closest to the antenna port can have the largest impact on second harmonic distortion. Suppression of second harmonic distortion can be particularly useful in transmit filters arranged to filter relatively high power signals.

A bulk acoustic wave resonator with a plurality of resonant frequencies can be arranged as a series resonator in a ladder filter to contribute to a lower frequency edge of a pass band of a band pass filter. A bulk acoustic wave resonator with a plurality of anti-resonant frequencies can be arranged as a series resonator in a ladder filter to contribute to an upper frequency edge of a pass band of a band pass filter. In an embodiment, a ladder filter can include a shunt resonator with a plurality of resonant frequencies and a series resonator with a plurality of anti-resonant frequencies.

Notch filters can include a bulk acoustic wave resonator with a plurality of resonances. For example, a notch filter can include an inductor-capacitor low pass filter and a shunt bulk acoustic wave resonator with a plurality of resonant frequencies. As another example, a notch filter can include an inductor-capacitor high pass filter and a bulk acoustic wave resonator with a plurality of anti-resonant frequencies.

Figure 12:
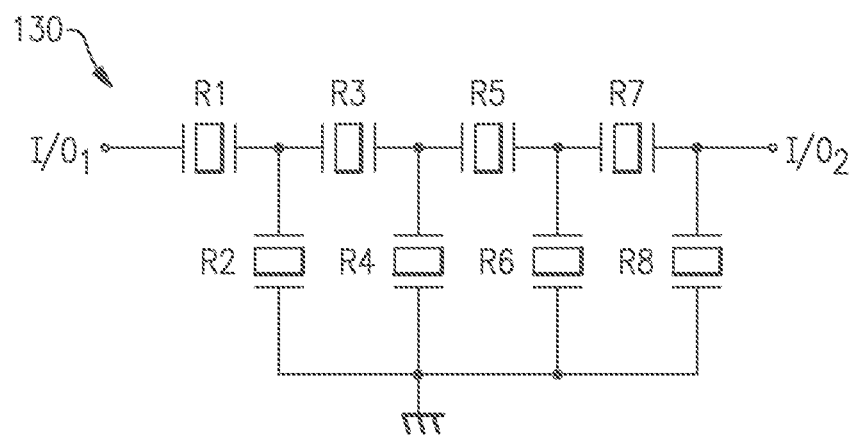
FIG. 12 is a schematic diagram of a ladder filter that includes a bulk acoustic wave resonator according to an embodiment.

FIG. 12 is a schematic diagram of a ladder filter 130 that includes a bulk acoustic wave resonator according to an embodiment. The ladder filter 130 is an example topology that can implement a band pass filter formed from acoustic wave resonators. In a band pass filter with a ladder filter topology, the shunt resonators can have lower resonant frequencies than the series resonators. The ladder filter 130 can be arranged to filter a radio frequency signal. As illustrated, the ladder filter 130 includes series acoustic wave resonators R1 R3, R5, and R7 and shunt acoustic wave resonators R2, R4, R6, and R8 coupled between a first input/output port $I/O_1$ and a second input/output port $I/O_2$. Any suitable number of series acoustic wave resonators can be in included in a ladder filter. Any suitable number of shunt acoustic wave resonators can be included in a ladder filter. The first input/output port $I/O_1$ can a transmit port and the second input/output port $I/O_2$ can be an antenna port. Alternatively, first input/output port $I/O_1$ can be a receive port and the second input/output port $I/O_2$ can be an antenna port.

One or more of the acoustic wave resonators of the ladder filter 130 can include a bulk acoustic wave filter according to an embodiment. For example, the series resonator R7 can be a BAW resonator disclosed herein with second harmonic distortion suppression when the second input/output port $I/O_2$ is an antenna port. In the ladder filter 130, the series resonator R7 is the series resonator closest to the second input/output port $I/O_2$. All other series resonators of the ladder filter 130 are connected to the second input/output port $I/O_2$ by way of the series resonator R7. Alternatively or additionally, one or more of the shunt resonators (e.g., shunt resonator R2 and/or R4) can be a bulk acoustic wave resonator with a plurality of resonant frequencies and/or one or more of the series resonators can be a bulk acoustic wave resonator with a plurality of anti-resonant frequencies. In certain applications, the ladder filter includes a BAW resonator with second harmonic suppression (e.g., series resonator R7) and at least one shunt resonator with a plurality of resonant frequencies (e.g., shunt resonator R2 and/or R4).

Figure 13:
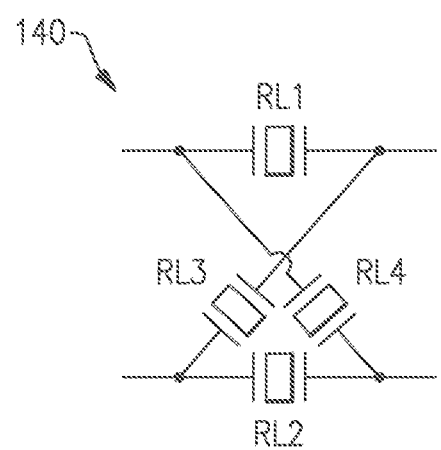
FIG. 13 is a schematic diagram of a lattice filter that includes a bulk acoustic wave resonator according to an embodiment.

FIG. 13 is a schematic diagram of a lattice filter 140 that includes a bulk acoustic wave resonator according to an embodiment. The lattice filter 140 is an example topology that can form a band pass filter from acoustic wave resonators. The lattice filter 140 can be arranged to filter an RF signal. As illustrated, the lattice filter 140 includes acoustic wave resonators RL1, RL2, RL3, and RL4. The acoustic wave resonators RL1 and RL2 are series resonators. The acoustic wave resonators RL3 and RL4 are shunt resonators.

The illustrated lattice filter 140 has a balanced input and a balanced output. One or more of the illustrated acoustic wave resonators RL1 to RL4 can be a bulk acoustic wave resonator in accordance with any suitable principles and advantages disclosed herein.

Figure 14:
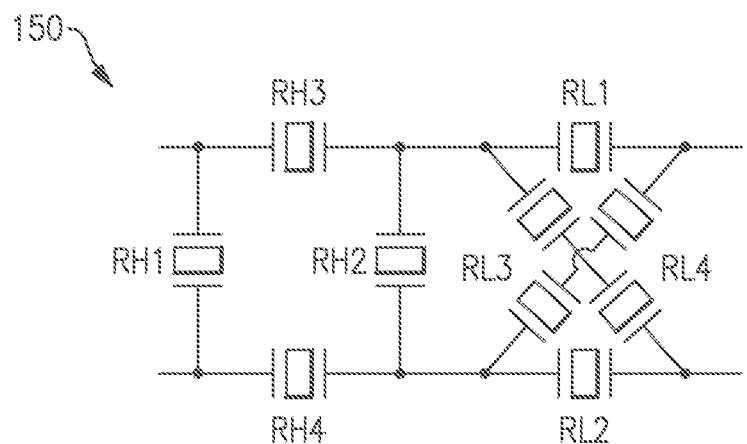
FIG. 14 is a schematic diagram of a hybrid ladder lattice filter that includes a bulk acoustic wave resonator according to an embodiment.

FIG. 14 is a schematic diagram of a hybrid ladder and lattice filter 150 that includes a bulk acoustic wave resonator according to an embodiment. The illustrated hybrid ladder and lattice filter 150 includes series acoustic resonators RL1, RL2, RH3, and RH4 and shunt acoustic resonators RL3, RL4, RH1, and RH2. The hybrid ladder and lattice filter 150 includes one or more bulk acoustic wave resonators in accordance with any suitable principles and advantages disclosed herein.

According to certain applications, a bulk acoustic wave resonator in accordance with any suitable principles and advantages disclosed herein can be included in filter that also includes one or more inductors and one or more capacitors.

One or more bulk acoustic wave resonators including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more BAW resonators disclosed herein. FR1 can be from 410 megahertz (MHz) to 7.125 gigahertz (GHz), for example, as specified in a current 5G NR specification. One or more bulk acoustic wave resonators in accordance with any suitable principles and advantages disclosed herein can be included in a filter arranged to filter a radio frequency signal in a fourth generation (4G) Long Term Evolution (LTE) operating band. One or more bulk acoustic wave resonators in accordance with any suitable principles and advantages disclosed herein can be included in a filter having a passband that includes a 4G LTE operating band and a 5G NR operating band. Such a filter can be implemented in a dual connectivity application, such as an E-UTRAN New Radio—Dual Connectivity (ENDC) application. One or more bulk acoustic wave resonators in accordance with any suitable principles and advantages disclosed herein can be included in an acoustic wave filter for higher frequency bands within FR1, such as frequency bands above 3 gigahertz (GHz) and/or frequency bands above 5 GHz within FR1. A filter with a bulk acoustic wave resonator disclosed herein can be used for a 5G NR band with a relatively wide pass band.

The bulk acoustic wave resonators disclosed herein can be implemented in a standalone filter and/or in a filter in any suitable multiplexer. Such filters can be any suitable topology, such as any filter topology of FIGS. 12 to 14. The filter can be a band pass filter arranged to filter a 4G LTE band and/or 5G NR band. Examples of a standalone filter and multiplexers will be discussed with reference to FIGS. 15A to 15E. Any suitable principles and advantages of these filters and/or multiplexers can be implemented together with each other.

Figure 15A:
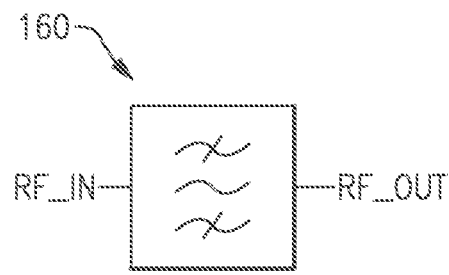
FIG. 15A is a schematic diagram of an acoustic wave filter.

FIG. 15A is schematic diagram of an acoustic wave filter 160. The acoustic wave filter 160 is a band pass filter. The acoustic wave filter 160 is arranged to filter a radio frequency signal. The acoustic wave filter 160 includes one or more acoustic wave devices coupled between a first input/output port RF_IN and a second input/output port RF_OUT. The acoustic wave filter 160 includes a bulk acoustic wave resonator according to an embodiment.

Figure 15B:
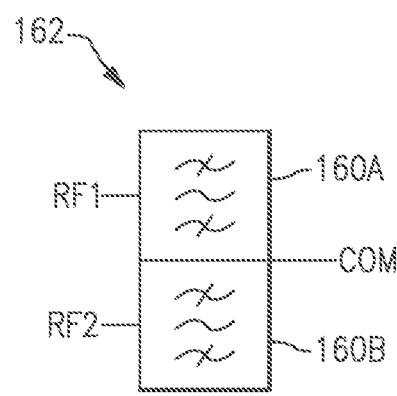
FIG. 15B is a schematic diagram of a duplexer.

FIG. 15B is a schematic diagram of a duplexer 162 that includes an acoustic wave filter according to an embodiment. The duplexer 162 includes a first filter 160A and a second filter 160B coupled to together at a common node COM. One of the filters of the duplexer 162 can be a transmit filter and the other of the filters of the duplexer 162 can be a receive filter. In some other instances, such as in a diversity receive application, the duplexer 162 can include two receive filters. Alternatively, the duplexer 162 can include two transmit filters. The common node COM can be an antenna node.

The first filter 160A is an acoustic wave filter arranged to filter a radio frequency signal. The first filter 160A includes one or more acoustic wave resonators coupled between a first radio frequency node RF1 and the common node COM. The first radio frequency node RF1 can be a transmit node or a receive node. The first filter 160A includes a bulk acoustic wave resonator in accordance with any suitable principles and advantages disclosed herein.

The second filter 160B can be any suitable filter arranged to filter a second radio frequency signal. The second filter 160B can be, for example, an acoustic wave filter, an acoustic wave filter that includes a bulk acoustic wave resonator with a plurality of resonant frequencies, an acoustic wave filter that includes a bulk acoustic wave resonator with a plurality of anti-resonant frequencies, an acoustic wave filter that includes a bulk acoustic wave resonator with second harmonic suppression, an LC filter, a hybrid acoustic wave LC filter, or the like. The second filter 160B is coupled between a second radio frequency node RF2 and the common node. The second radio frequency node RF2 can be a transmit node or a receive node.

Although example embodiments may be discussed with filters or duplexers for illustrative purposes, any suitable principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can include any suitable number of bulk acoustic wave devices in accordance with any suitable principles and advantages disclosed herein.

Figure 15C:
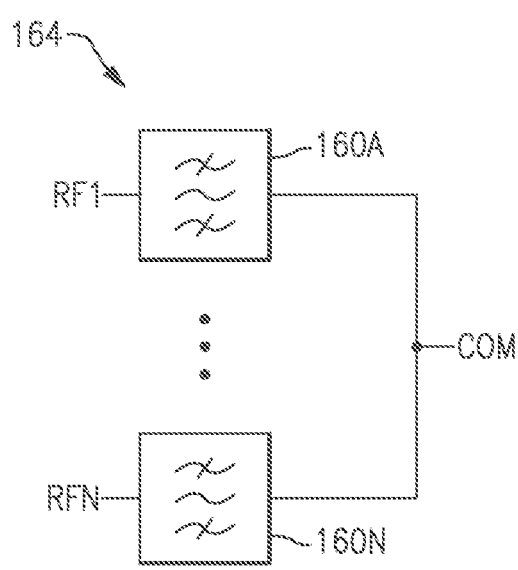
FIG. 15C is a schematic diagram of a multiplexer with hard multiplexing.

FIG. 15C is a schematic diagram of a multiplexer 164 that includes an acoustic wave filter according to an embodiment. The multiplexer 164 includes a plurality of filters 160A to 160N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. As illustrated, the filters 160A to 160N each have a fixed electrical connection to the common node COM. This can be referred to as hard multiplexing or fixed multiplexing. Filters have fixed electrical connections to the common node in hard multiplexing applications.

The first filter 160A is an acoustic wave filter arranged to filter a radio frequency signal. The first filter 160A can include one or more acoustic wave devices coupled between a first radio frequency node RF1 and the common node COM. The first radio frequency node RF1 can be a transmit node or a receive node. The first filter 160A includes a bulk acoustic wave resonator in accordance with any suitable principles and advantages disclosed herein. The other filter(s) of the multiplexer 164 can include one or more acoustic wave filters, one or more acoustic wave filters that include a bulk acoustic wave resonator in accordance with any suitable principles and advantages disclosed herein, one or more LC filters, one or more hybrid acoustic wave LC filters, the like, or any suitable combination thereof.

Figure 15D:
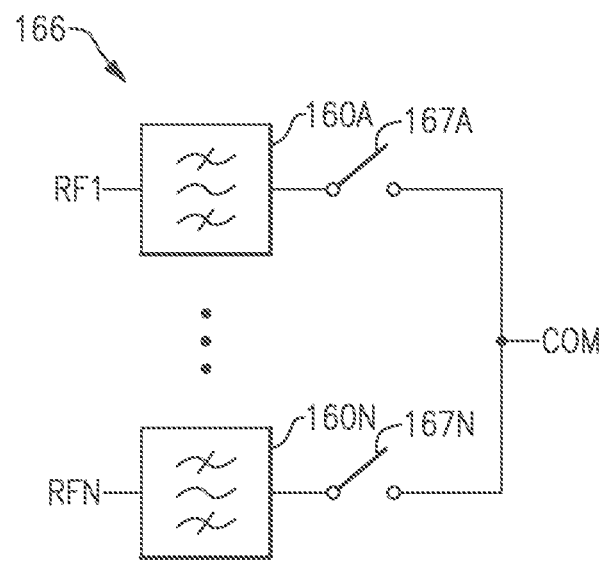
FIG. 15D is a schematic diagram of a multiplexer with switched multiplexing.

FIG. 15D is a schematic diagram of a multiplexer 166 that includes an acoustic wave filter according to an embodiment. The multiplexer 166 is like the multiplexer 164 of FIG. 15C, except that the multiplexer 166 implements switched multiplexing. In switched multiplexing, a filter is coupled to a common node via a switch. In the multiplexer 166, the switches 167A to 167N can selectively electrically connect respective filters 160A to 160N to the common node COM. For example, the switch 167A can selectively electrically connect the first filter 160A the common node COM via the switch 167A. Any suitable number of the switches 167A to 167N can electrically a respective filters 160A to 160N to the common node COM in a given state. Similarly, any suitable number of the switches 167A to 167N can electrically isolate a respective filter 160A to 160N to the common node COM in a given state. The functionality of the switches 167A to 167N can support various carrier aggregations.

Figure 15E:
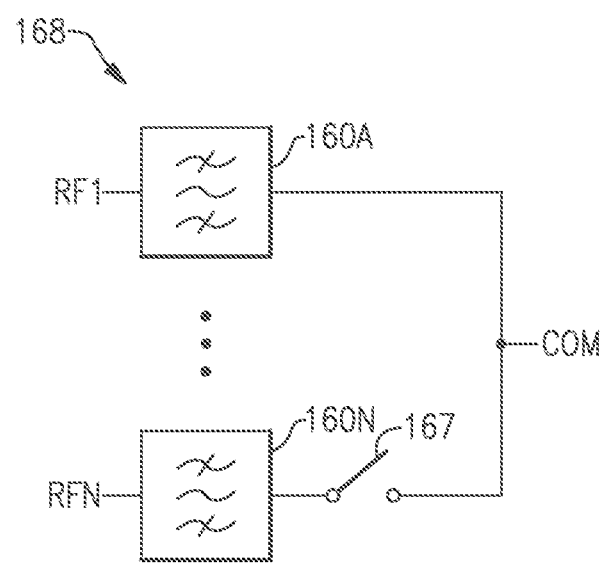
FIG. 15E is a schematic diagram of a multiplexer with a combination of hard multiplexing and switched multiplexing.

FIG. 15E is a schematic diagram of a multiplexer 168 that includes an acoustic wave filter according to an embodiment. The multiplexer 168 illustrates that a multiplexer can include any suitable combination of hard multiplexed and switched multiplexed filters. One or more bulk acoustic wave devices in accordance with any suitable principles and advantages disclosed herein can be included in a filter that is hard multiplexed to the common node of a multiplexer. Alternatively or additionally, one or more bulk acoustic wave devices in accordance with any suitable principles and advantages disclosed herein can be included in a filter that is switch multiplexed to the common node of a multiplexer.

The acoustic wave devices disclosed herein can be implemented in a variety of packaged modules. Some example packaged modules will now be disclosed in which any suitable principles and advantages of the acoustic wave devices, acoustic wave filters, or multiplexers disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 16 to 20 are schematic block diagrams of illustrative packaged modules according to certain embodiments. Any suitable combination of features of these packaged modules can be implemented with each other. While duplexers are illustrated in the example packaged modules of FIGS. 17, 18, and 20, any other suitable multiplexer that includes a plurality of filters coupled to a common node and/or standalone filter can be implemented instead of one or more duplexers. For example, a quadplexer can be implemented in certain applications. As another example, one or more filters of a packaged module can be arranged as a transmit filter or a receive filter that is not included in a multiplexer.

Figure 16:
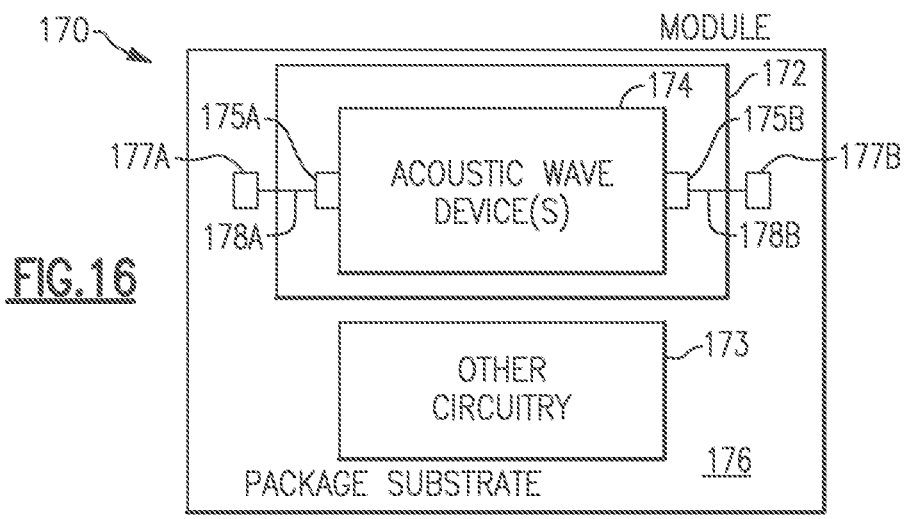
FIG. 16 is a schematic diagram of a radio frequency module that includes an acoustic wave filter according to an embodiment.

FIG. 16 is a schematic diagram of a radio frequency module 170 that includes an acoustic wave component 172 according to an embodiment. The illustrated radio frequency module 170 includes the acoustic wave component 172 and other circuitry 173. The acoustic wave component 172 can include one or more bulk acoustic wave devices in accordance with any suitable combination of features of the acoustic wave filters disclosed herein. The acoustic wave component 172 can include an acoustic wave filter that includes a plurality of bulk acoustic wave resonators, for example.

The acoustic wave component 172 shown in FIG. 16 includes one or more acoustic wave devices 174 and terminals 175A and 175B. The one or more acoustic wave devices 174 include at least one bulk acoustic wave device implemented in accordance with any suitable principles and advantages disclosed herein. The terminals 175A and 174B can serve, for example, as an input contact and an output contact. Although two terminals are illustrated, any suitable number of terminals can be implemented for a particular application. The acoustic wave component 172 and the other circuitry 173 are on a common packaging substrate 176 in FIG. 16. The package substrate 176 can be a laminate substrate. The terminals 175A and 175B can be electrically connected to contacts 177A and 177B, respectively, on the packaging substrate 176 by way of electrical connectors 178A and 178B, respectively. The electrical connectors 178A and 178B can be bumps or wire bonds, for example.

The other circuitry 173 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. The other circuitry 173 can be electrically connected to the one or more acoustic wave devices 174. The radio frequency module 170 can include one or more packaging structures to, for example, provide protection and/or facilitate easier handling of the radio frequency module 170. Such a packaging structure can include an overmold structure formed over the packaging substrate 176. The overmold structure can encapsulate some or all of the components of the radio frequency module 170.

Figure 17:
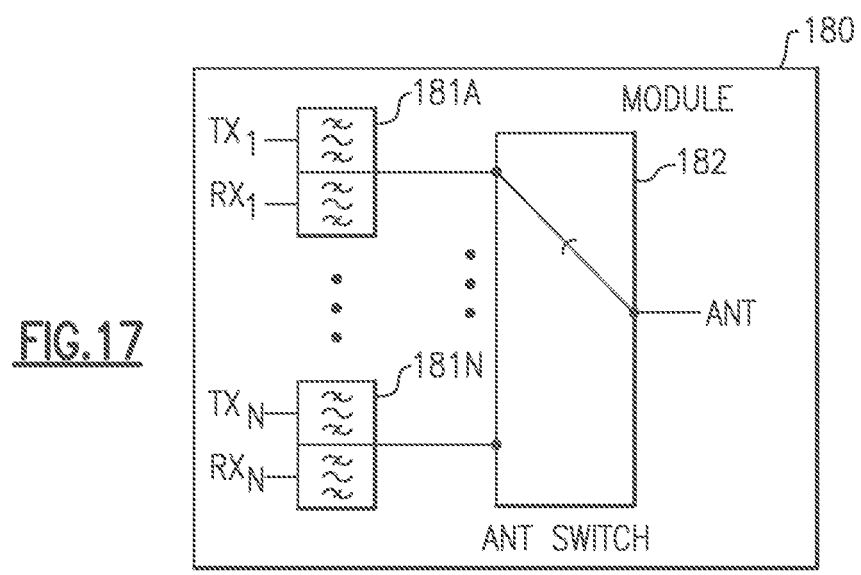
FIG. 17 is a schematic block diagram of a module that includes an antenna switch and duplexers according to an embodiment.

FIG. 17 is a schematic block diagram of a module 180 that includes duplexers 181A to 181N and an antenna switch 182. One or more filters of the duplexers 181A to 181N can include a bulk acoustic wave device in accordance with any suitable principles and advantages disclosed herein. Any suitable number of duplexers 181A to 181N can be implemented. The antenna switch 182 can have a number of throws corresponding to the number of duplexers 181A to 181N. The antenna switch 182 can include one or more additional throws coupled to one or more filters external to the module 180 and/or coupled to other circuitry. The antenna switch 182 can electrically couple a selected duplexer to an antenna port of the module 180.

Figure 18:
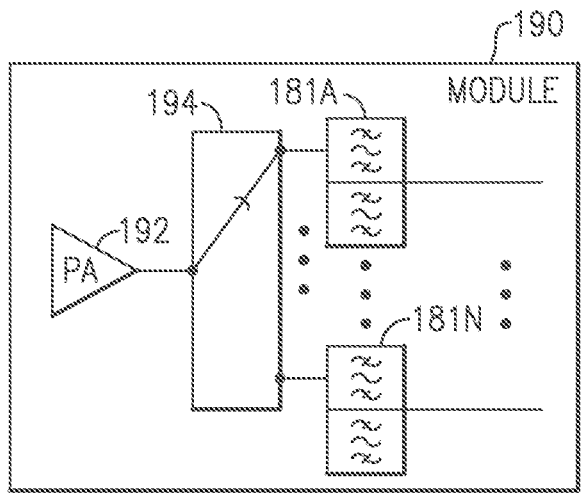
FIG. 18 is a schematic block diagram of a module that includes a power amplifier, a radio frequency switch, and duplexers according to an embodiment.

FIG. 18 is a schematic block diagram of a module 190 that includes a power amplifier 192, a radio frequency switch 194, and duplexers 181A to 181N according to an embodiment. The power amplifier 192 can amplify a radio frequency signal. The radio frequency switch 194 can be a multi-throw radio frequency switch. The radio frequency switch 194 can electrically couple an output of the power amplifier 192 to a selected transmit filter of the duplexers 181A to 181N. One or more filters of the duplexers 181A to 181N can include a bulk acoustic wave device in accordance with any suitable principles and advantages disclosed herein. Any suitable number of duplexers 181A to 181N can be implemented.

Figure 19:
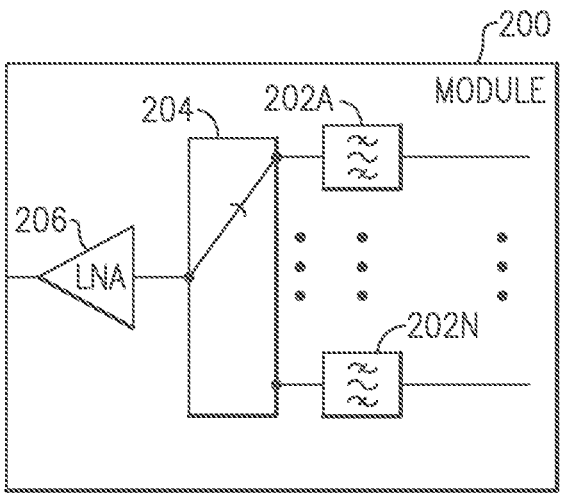
FIG. 19 is a schematic block diagram of a module that includes a low noise amplifier, a radio frequency switch, and filters according to an embodiment.

FIG. 19 is a schematic block diagram of a module 200 that includes filters 202A to 202N, a radio frequency switch 204, and a low noise amplifier 206 according to an embodiment. One or more filters of the filters 202A to 202N can include any suitable number of bulk acoustic wave devices in accordance with any suitable principles and advantages disclosed herein. Any suitable number of filters 202A to 202N can be implemented. The illustrated filters 202A to 202N are receive filters. One or more of the filters 202A to 202N can be included in a multiplexer that also includes a transmit filter and/or another receive filter. The radio frequency switch 204 can be a multi-throw radio frequency switch. The radio frequency switch 204 can electrically couple an output of a selected filter of filters 202A to 202N to the low noise amplifier 206. In some embodiments, a plurality of low noise amplifiers can be implemented. The module 200 can include diversity receive features in certain applications.

Figure 20:
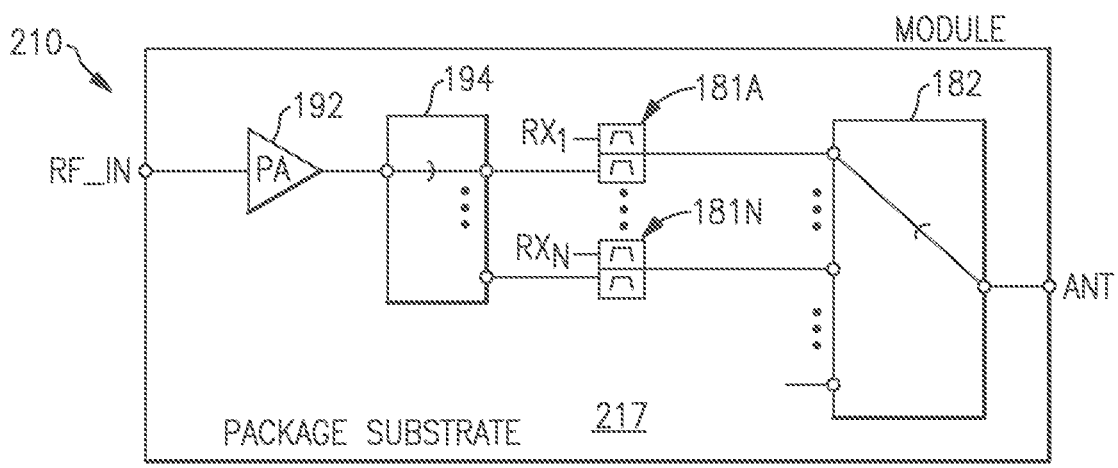
FIG. 20 is a schematic diagram of a radio frequency module that includes an acoustic wave filter according to an embodiment.

FIG. 20 is a schematic diagram of a radio frequency module 210 that includes an acoustic wave filter according to an embodiment. As illustrated, the radio frequency module 210 includes duplexers 181A to 181N, a power amplifier 192, a select switch 194, and an antenna switch 182. The radio frequency module 210 can include a package that encloses the illustrated elements. The illustrated elements can be disposed on a common packaging substrate 217. The packaging substrate 217 can be a laminate substrate, for example. A radio frequency module that includes a power amplifier can be referred to as a power amplifier module. A radio frequency module can include a subset of the elements illustrated in FIG. 20 and/or additional elements. The radio frequency module 210 may include any one of the acoustic wave filters that include at least one bulk acoustic wave resonator in accordance with any suitable principles and advantages disclosed herein.

The duplexers 181A to 181N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters can include a bulk acoustic wave device in accordance with any suitable principles and advantages disclosed herein. Similarly, one or more of the receive filters can include a bulk acoustic wave device in accordance with any suitable principles and advantages disclosed herein. Although FIG. 20 illustrates duplexers, any suitable principles and advantages disclosed herein can be implemented in other multiplexers (e.g., quadplexers, hexaplexers, octoplexers, etc.) and/or in switch-plexers and/or with standalone filters.

The power amplifier 192 can amplify a radio frequency signal. The illustrated switch 194 is a multi-throw radio frequency switch. The switch 194 can electrically couple an output of the power amplifier 192 to a selected transmit filter of the transmit filters of the duplexers 181A to 181N. In some instances, the switch 194 can electrically connect the output of the power amplifier 192 to more than one of the transmit filters. The antenna switch 182 can selectively couple a signal from one or more of the duplexers 181A to 181N to an antenna port ANT. The duplexers 181A to 181N can be associated with different frequency bands and/or different modes of operation (e.g., different power modes, different signaling modes, etc.).

Figure 21:
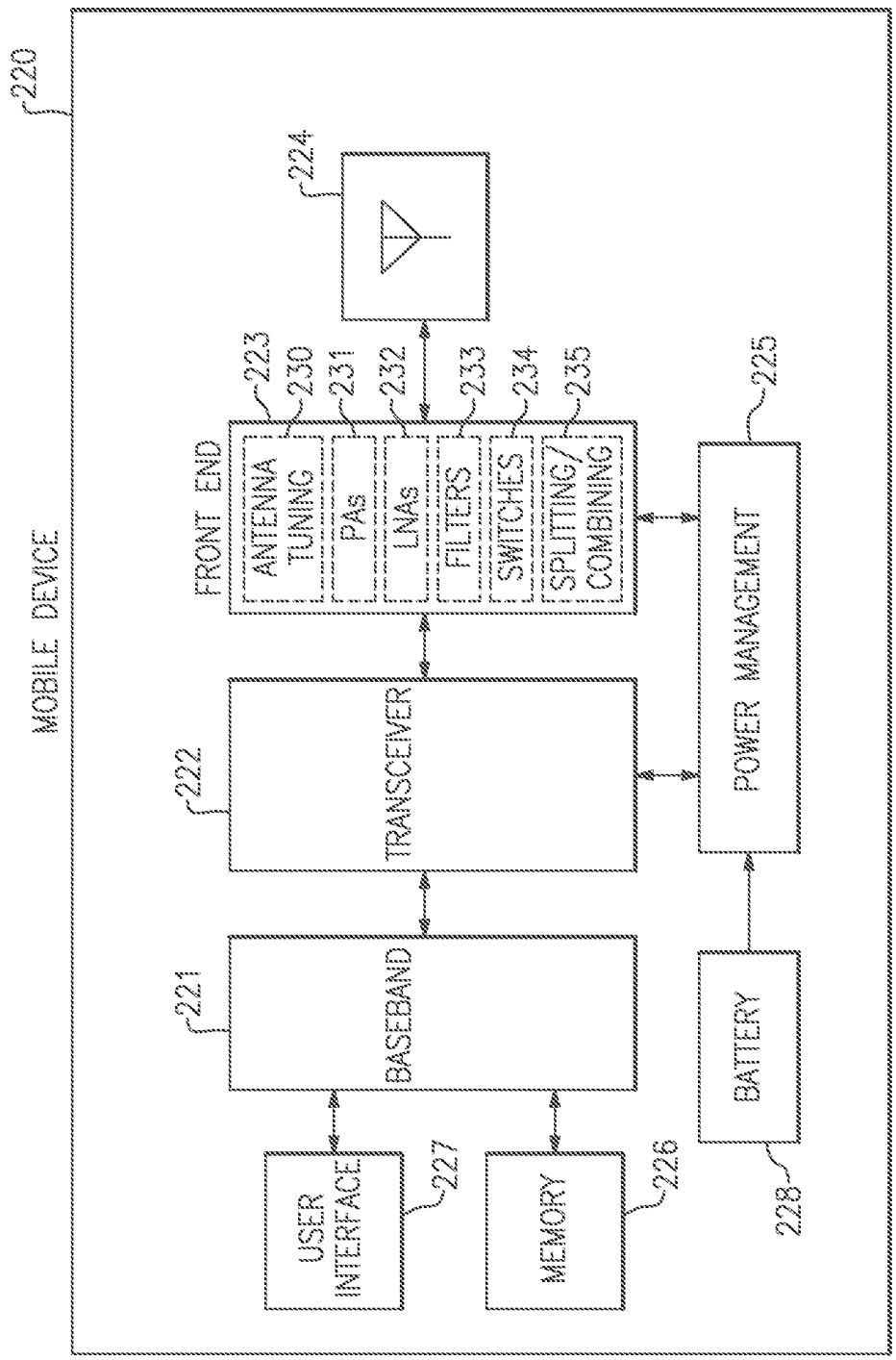
FIG. 21 is a schematic block diagram of a wireless communication device that includes a filter according to an embodiment.

The bulk acoustic wave devices disclosed herein can be implemented in wireless communication devices. FIG. 21 is a schematic block diagram of a wireless communication device 220 that includes a filter according to an embodiment. The wireless communication device 220 can be a mobile device. The wireless communication device 220 can be any suitable wireless communication device. For instance, a wireless communication device 220 can be a mobile phone, such as a smart phone. As illustrated, the wireless communication device 220 includes a baseband system 221, a transceiver 222, a front end system 223, one or more antennas 224, a power management system 225, a memory 226, a user interface 227, and a battery 228.

The wireless communication device 220 can be used communicate using a wide variety of communications technologies, including, but not limited to, 2G, 3G, 4G (including LTE, LTE-Advanced, and/or LTE-Advanced Pro), 5G NR, WLAN (for instance, Wi-Fi), WPAN (for instance, Bluetooth and/or ZigBee), WMAN (for instance, WiMax), and/or GPS technologies.

The transceiver 222 generates RF signals for transmission and processes incoming RF signals received from the antennas 224. Various functionalities associated with the transmission and receiving of RF signals can be achieved by one or more components that are collectively represented in FIG. 21 as the transceiver 222. In one example, separate components (for instance, separate circuits or dies) can be provided for handling certain types of RF signals.

The front end system 223 aids in conditioning signals provided to and/or received from the antennas 224. In the illustrated embodiment, the front end system 223 includes antenna tuning circuitry 230, power amplifiers (PAs) 231, low noise amplifiers (LNAs) 232, filters 233, switches 234, and signal splitting/combining circuitry 235. However, other implementations are possible. The filters 233 can include one or more acoustic wave filters that include any suitable number of bulk acoustic wave devices in accordance with any suitable principles and advantages disclosed herein.

For example, the front end system 223 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 220 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 224 can include antennas used for a wide variety of types of communications. For example, the antennas 224 can include antennas for transmitting and/or receiving signals associated with a wide variety of frequencies and communications standards.

In certain implementations, the antennas 224 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 220 can operate with beamforming in certain implementations. For example, the front end system 223 can include amplifiers having controllable gain and phase shifters having controllable phase to provide beam formation and directivity for transmission and/or reception of signals using the antennas 224. For example, in the context of signal transmission, the amplitude and phases of the transmit signals provided to the antennas 224 are controlled such that radiated signals from the antennas 224 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 224 from a particular direction. In certain implementations, the antennas 224 include one or more arrays of antenna elements to enhance beamforming.

The baseband system 221 is coupled to the user interface 227 to facilitate processing of various user input and output (I/O), such as voice and data. The baseband system 221 provides the transceiver 222 with digital representations of transmit signals, which the transceiver 222 processes to generate RF signals for transmission. The baseband system 221 also processes digital representations of received signals provided by the transceiver 222. As shown in FIG. 21, the baseband system 221 is coupled to the memory 226 of facilitate operation of the wireless communication device 220.

The memory 226 can be used for a wide variety of purposes, such as storing data and/or instructions to facilitate the operation of the wireless communication device 220 and/or to provide storage of user information.

The power management system 225 provides a number of power management functions of the wireless communication device 220. In certain implementations, the power management system 225 includes a PA supply control circuit that controls the supply voltages of the power amplifiers 231. For example, the power management system 225 can be configured to change the supply voltage(s) provided to one or more of the power amplifiers 231 to improve efficiency, such as power added efficiency (PAE).

As shown in FIG. 21, the power management system 225 receives a battery voltage from the battery 228. The battery 228 can be any suitable battery for use in the wireless communication device 220, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. An acoustic wave device with multiple piezoelectric layers, the acoustic wave device comprising:
   a first electrode;
   a second electrode;
   a plurality of piezoelectric layers positioned laterally relative to each other and between the first electrode and the second electrode, the plurality of piezoelectric layers including a first piezoelectric layer and a second piezoelectric layer having a c-axis orientation that is different than the first piezoelectric layer, and at least part of the first piezoelectric layer and at least part of the second piezoelectric layer being in a main acoustically active region of the acoustic wave device; and
   a raised frame structure in a frame region of the acoustic wave device, the frame region being around the main acoustically active region.

2. The acoustic wave device of claim 1 wherein a c-axis of the first piezoelectric layer is oriented in an opposite direction relative to a c-axis of the second piezoelectric layer.

3. The acoustic wave device of claim 1 wherein second harmonic distortion generated by the second piezoelectric layer substantially cancels second harmonic distortion generated by the first piezoelectric layer.

4. The acoustic wave device of claim 1 wherein the first piezoelectric layer is in physical contact with the first electrode and the second electrode on opposing sides, and the second piezoelectric layer is in physical contact with at least the second electrode.

5. The acoustic wave device of claim 1 wherein the plurality of piezoelectric layers includes a third piezoelectric layer positioned laterally relative to the second piezoelectric layer, and the third piezoelectric layer has a property that is different than both the first and second piezoelectric layers.

6. The acoustic wave device of claim 1 wherein the acoustic wave device is a film bulk acoustic wave resonator.

7. The acoustic wave device of claim 1 wherein the acoustic wave device is a bulk acoustic wave solidly mounted resonator.

8. The acoustic wave device of claim 1 further comprising a recessed frame structure in the frame region.

9. The acoustic wave device of claim 1 wherein the raised frame structure includes multiple layers.

10. An acoustic wave filter comprising:
    a first acoustic wave resonator including a first electrode, a second electrode, a raised frame structure, and a plurality of piezoelectric layers positioned laterally relative to each other and between the first electrode and the second electrode, the plurality of piezoelectric layers including a first piezoelectric layer and a second piezoelectric layer having a different c-axis orientation than the first piezoelectric layer, at least part of the first piezoelectric layer and at least part of the second piezoelectric layer being in a main acoustically active region of the first acoustic wave resonator, and the raised frame structure being in a frame region that is around the main acoustically active region; and
    a plurality of additional acoustic wave resonators, the first acoustic wave resonator and the plurality of additional acoustic wave resonators together configured to filter a radio frequency signal.

11. The acoustic wave filter of claim 10 wherein the first acoustic wave resonator is configured to suppress a nonlinearity of the acoustic wave filter.

12. The acoustic wave filter of claim 10 wherein the first acoustic wave resonator is configured to suppress second harmonic distortion of the acoustic wave filter.

13. The acoustic wave filter of claim 12 wherein the acoustic wave filter has an antenna port and the first acoustic wave resonator is a series resonator closest to the antenna port.

14. The acoustic wave filter of claim 10 wherein the first acoustic wave resonator has a plurality of resonant frequencies.

15. The acoustic wave filter of claim 10 wherein the first acoustic wave resonator has a plurality of anti-resonant frequencies.

16. The acoustic wave filter of claim 10 wherein the first acoustic wave resonator is a shunt resonator.

17. The acoustic wave filter of claim 10 wherein a c-axis of the first piezoelectric layer is oriented in an opposite direction relative to a c-axis of the second piezoelectric layer.

18. A radio frequency module comprising:
    an acoustic wave filter including a plurality of acoustic wave resonators configured to filter a radio frequency signal, the plurality of acoustic wave resonators including a first acoustic wave resonator, the first acoustic wave resonator including a first electrode, a second electrode, a raised frame structure, and a plurality of piezoelectric layers positioned laterally relative to each other and between the first electrode and the second electrode, the plurality of piezoelectric layers including a first piezoelectric layer and a second piezoelectric layer having a different c-axis orientation than the first piezoelectric layer, at least part of the first piezoelectric layer and at least part of the second piezoelectric layer being in a main acoustically active region of the first acoustic wave resonator, and the raised frame structure being in a frame region that is around the main acoustically active region; and
    a radio frequency circuit element coupled to the acoustic wave filter, the acoustic wave filter and the radio frequency circuit element being enclosed within a common package.

19. The radio frequency module of claim 18 wherein the radio frequency circuit element is a low noise amplifier.

20. The radio frequency module of claim 18 wherein the first acoustic wave resonator further includes a recessed frame structure in the frame region.

* * * * *